United States Patent
El Hajjam et al.

(10) Patent No.: US 11,393,876 B2
(45) Date of Patent: Jul. 19, 2022

(54) THREE DIMENSIONAL RESISTIVE RANDOM ACCESS MEMORY AND METHOD ENABLING SUCH A MEMORY TO BE OBTAINED

(71) Applicant: COMMISSARIAT A L'ENERGIE ATOMIQUE ET AUX ENERGIES ALTERNATIVES, Paris (FR)

(72) Inventors: Khalil El Hajjam, Grenoble (FR); Gabriel Molas, Grenoble (FR); Jean-François Nodin, Quaix en Chartreuse (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 122 days.

(21) Appl. No.: 16/956,037

(22) PCT Filed: Dec. 18, 2018

(86) PCT No.: PCT/EP2018/085667
§ 371 (c)(1),
(2) Date: Jun. 19, 2020

(87) PCT Pub. No.: WO2019/121796
PCT Pub. Date: Jun. 27, 2019

(65) Prior Publication Data
US 2020/0411592 A1    Dec. 31, 2020

(30) Foreign Application Priority Data

Dec. 22, 2017 (FR) ...................................... 1762939

(51) Int. Cl.
*H01L 27/24* (2006.01)
*H01L 45/00* (2006.01)

(52) U.S. Cl.
CPC ........ *H01L 27/249* (2013.01); *H01L 27/2409* (2013.01); *H01L 45/1675* (2013.01); *H01L 45/1226* (2013.01); *H01L 45/1253* (2013.01)

(58) Field of Classification Search
None
See application file for complete search history.

(56) References Cited

U.S. PATENT DOCUMENTS 10,083,974 B1 * 9/2018 Huang ................ H01L 45/1233
10,622,558 B2 * 4/2020 Fratin ................ H01L 45/1616
(Continued)

FOREIGN PATENT DOCUMENTS

| WO | WO 2017/111776 A1 | 6/2017 |
| WO | WO 2017/131642 A1 | 8/2017 |
| WO | WO 2017/160233 A1 | 9/2017 |

OTHER PUBLICATIONS

International Search Report as issued in International Patent Application No. PCT/EP2018/085667, dated Apr. 3, 2019.

*Primary Examiner* — Mounir S Amer
(74) *Attorney, Agent, or Firm* — Pillsbury Winthrop Shaw Pittman LLP

(57) ABSTRACT

A three dimensional memory includes flat electrodes, each defining a plane; a vertical electrode, extending essentially along an axis perpendicular to the plane defined by each flat electrode; floating electrodes, each situated between a flat electrode and the vertical electrode; first layers of an insulating material, each flat electrode being separated from the preceding and/or following flat electrode by a first layer of an insulating material; first layers of a first active material, each layer of an active material separating a flat electrode from the floating electrode that is associated therewith; a second layer of a second active material separating the vertical electrode from the floating electrodes. The first active material forms a selector or a memory point and the (Continued)

second active material forms a memory point or a selector. Each flat electrode includes first, second and third sub-layers made of, respectively, first, second and third conductive materials.

9 Claims, 32 Drawing Sheets

(56) References Cited

U.S. PATENT DOCUMENTS

| | | | |
|---|---|---|---|
| 2014/0264533 A1* | 9/2014 | Simsek-Ege | H01L 29/66825 257/316 |
| 2014/0361239 A1* | 12/2014 | Ramaswamy | H01L 27/2409 257/5 |
| 2015/0340406 A1 | 11/2015 | Jo | |

* cited by examiner

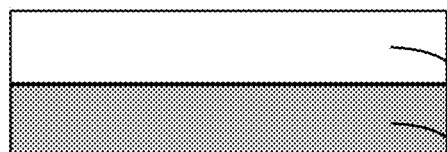
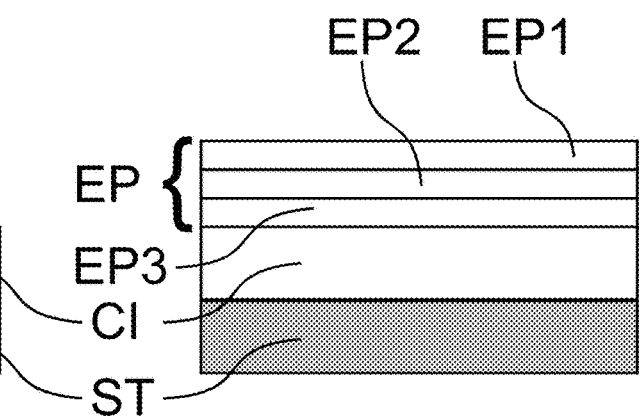
FIG. 8A   FIG. 8B
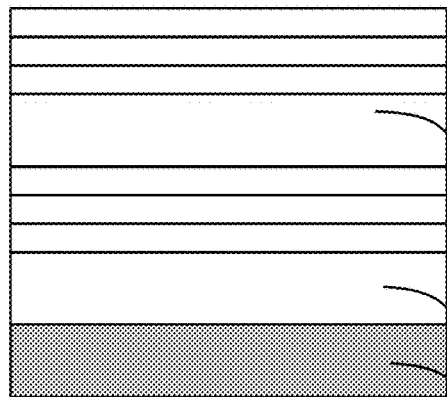
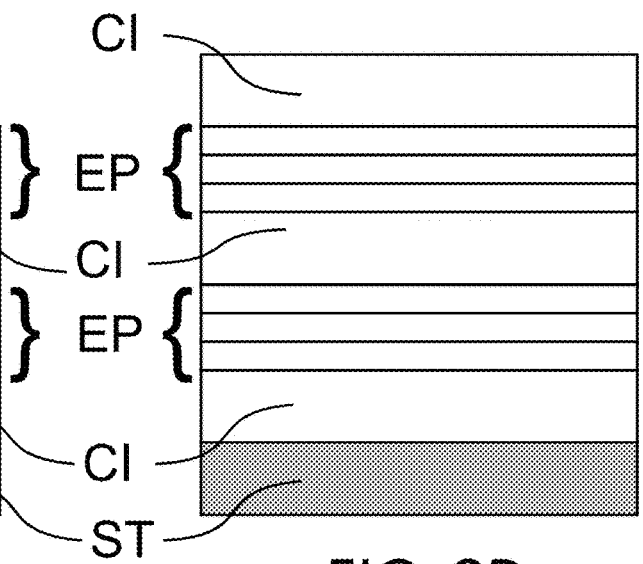
FIG. 8C   FIG. 8D
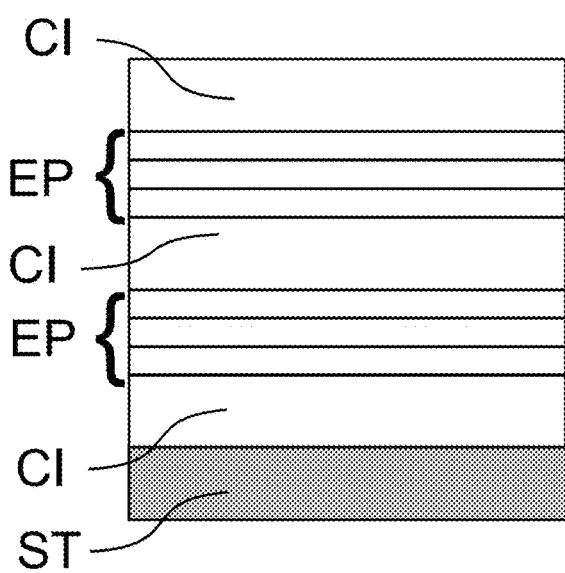
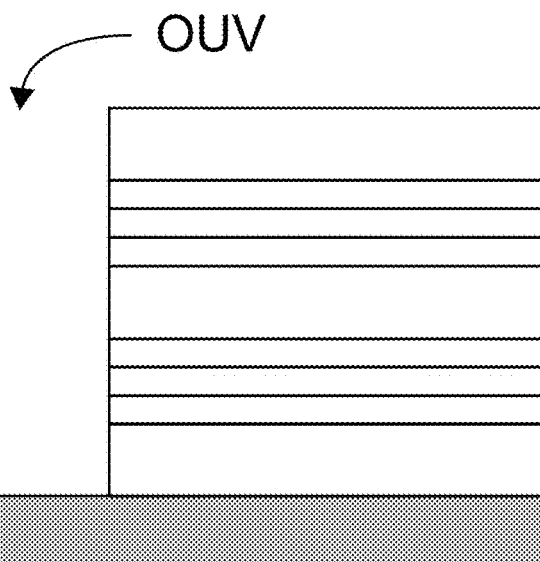
FIG. 8E

US 11,393,876 B2

THREE DIMENSIONAL RESISTIVE RANDOM ACCESS MEMORY AND METHOD ENABLING SUCH A MEMORY TO BE OBTAINED

CROSS-REFERENCE TO RELATED APPLICATIONS

This application is the U.S. National Stage of PCT/EP2018/085667, filed Dec. 18, 2018, which in turn claims priority to French patent application number 1762939 filed Dec. 22, 2017. The content of these applications are incorporated herein by reference in their entireties.

TECHNICAL FIELD OF THE INVENTION

The technical field of the invention is that of memories. The present invention relates to a three dimensional (hereafter 3D) memory and in particular a 3D memory wherein a selector is associated with each memory point. The invention also relates to a method enabling such a memory to be obtained.

TECHNOLOGICAL BACKGROUND OF THE INVENTION

In the technology of two dimensional (hereafter 2D) memories, a known problem linked to the addressing of a memory point PM is that of leakage paths. Indeed, as illustrated in FIG. 1A, when a reading potential is applied to a line and to a column in order to read a memory point PM of an array of memory points PM, the current passes not only through the target memory point PM (that is to say situated at the intersection of the selected line and column—solid line arrow), but also by parasitic paths (dashed line arrows) which may alter the reading of the memory point PM.

In 2D structures, it is easy to reduce or even eliminate the problem of parasitic paths by inserting a selector SE between the memory point PM and the addressing column or line, as illustrated in FIG. 1B. A selector SE is composed of a floating electrode EF (that is to say that it is not connected to any reference potential while the memory is in operation) of an active material C1/C2, in general chosen as a function of the active material C2/C1 used for the memory point PM and an electrode EP/EV. However, such a configuration has not until now been put in place in the case of 3D memories. Indeed, in the case of a 3D memory, the putting in place of a selector SE would lead to a short-circuit between the flat electrodes EP, said short-circuit being caused by the floating electrode EF.

There thus exists a need for a 3D memory comprising selectors SE in order to decrease or eliminate the problem of leakage paths. There also exists a need for a method enabling such a memory to be obtained.

SUMMARY OF THE INVENTION

The invention offers a solution to the aforementioned problems, by proposing a 3D memory device comprising a selector for each memory point. As a reminder, a 3D memory is the result of an integration strategy where the devices are organised in the three dimensions of space, and no longer uniquely in a horizontal plane as in traditional 2D memories. This configuration makes it possible to improve the performances of the memory devices while increasing storage density (and thus reducing manufacturing costs).

A first aspect of the invention relates to a 3D memory comprising a plurality of memory points and a plurality of selectors, each memory point of the plurality of memory points being associated with a selector of the plurality of selectors. More particularly, the three dimensional memory comprises:
  a plurality of first electrodes, referred to as flat electrodes, each flat electrode defining a plane;
  a second electrode, referred to as vertical electrode, extending essentially along an axis perpendicular to the planes defined by the flat electrodes of the plurality of flat electrodes;
  a plurality of third electrodes, referred to as floating electrodes, each floating electrode of the plurality of floating electrodes between situated between a flat electrode of the plurality of flat electrodes and the vertical electrode;
  a plurality of first layers of an insulating material, each flat electrode of the plurality of flat electrodes being separated from the preceding and/or following flat electrode by a first layer of an insulating material of the plurality of first layers of an insulating material;
  a plurality of first layers of a first active material, each layer of a first active material of the plurality of first layers of an active material separating a flat electrode of the plurality of flat electrodes from the floating electrode of the plurality of floating electrodes that is associated therewith;
  a second layer of a second active material separating the vertical electrode from the floating electrodes of the plurality of floating electrodes.

In addition, in a component according to a first aspect of the invention the first active material is capable of forming a selector or a memory point and the second active material is capable of forming a memory point or a selector. Active material is taken to mean a material of which the properties enable a non-volatile change of the resistance of the material (Resistive RAM) from a high resistance to a low resistance and vice-versa, or a material of which the properties enable a volatile change of the resistance of the material (selector) from a high resistance to a low resistance when the point is selected, then a return to a high resistance when the point is deselected. Moreover, each flat electrode of the plurality of flat electrodes comprises:
  a first sub-layer made of a first conductive material;
  a second sub-layer made of a second conductive material; and
  a third sub-layer made of a third conductive material.

Thanks to the invention, each memory point is associated with a selector which makes it possible to reduce or even to eliminate problems of leakage paths during the addressing of a memory point by means of the flat electrode and the vertical electrode corresponding to said memory point. In addition, each memory point is associated with a selector of which the geometry may be controlled by modulating the thickness of the layer of the first active material. Moreover, it is possible to modulate the shape of the proximal end of each flat electrode by varying the distance separating the proximal end of each of the sub-layers from the vertical electrode, said distance being measured in the plane formed by said layer or said sub-layer. The proximal end of a layer or a sub-layer is the end of said layer or sub-layer the closest to the considered vertical electrode.

Apart from the characteristics mentioned in the preceding paragraph, the memory according to a first aspect of the invention may have one or more of the complementary characteristics among the following, considered individually or according to all technically possible combinations thereof.

Advantageously, the proximal end of the first sub-layer and the proximal end of the third sub-layer are closer to the vertical electrode than the proximal end of the second sub-layer so as to form an indentation, a part of the floating electrode associated with the considered flat electrode being inserted into said indentation.

Thus, it is possible to benefit from the point effect occurring at the end of each floating electrode facing the second layer of the flat electrode that is associated therewith, for example to facilitate the formation of a filament enabling the storage of information.

Advantageously, the proximal end of the first sub-layer and the proximal end of the third sub-layer are further away from the vertical electrode than the proximal end of the second sub-layer so as to form a protuberance.

Thus, the thickness of the second sub-layer may be chosen such that the passage of a current causes heating at the level of the end of the considered flat electrode at the level of the proximal end of the second sub-layer, in particular when the memory point is a phase change memory point.

Advantageously, the thickness of the floating electrode is greater than the thickness of the second sub-layer of the flat electrode.

A second aspect of the invention relates to a method for manufacturing a 3D memory comprising:
  a first step of deposition of a first layer of an insulating material;
  a second step of deposition of a first layer of a conductive material on the first layer of an insulating material;
the first step of deposition of a first layer of an insulating material and the second step of deposition of a first layer of a conductive material being repeated so as to obtain a plurality of first layers of an insulating material and a plurality of first layers of a conductive material, the method also comprising:
  a first step of anisotropic etching in the plurality of first layers of an insulating material and in the plurality of first layers of a conductive material;
  a first step of selective etching of the plurality of first layers of a conductive material;
  a fourth step of conformal deposition of a first layer of a first active material;
  a fifth step of deposition of a second layer of a conductive material;
  a second step of anisotropic etching of the third layer of a conductive material and the first layer of a first active material;
  a sixth step of conformal deposition of a second layer of a second active material;
  a seventh step of deposition of a third layer of a conductive material.

In addition, the second step of deposition of a first layer of a conductive material on the first layer of an insulating material comprises:
  a step of deposition of a first sub-layer made of a first sub-layer conductive material;
  a step of deposition of a second sub-layer made of a second sub-layer conductive material;
  a step of deposition of a third sub-layer made of a third sub-layer conductive material.

Moreover, the material of the first sub-layer and the material of the third sub-layer are etched at a rate different to that at which the material of the second sub-layer is etched during the first step of selective etching of the plurality of first layers of a conductive material.

Thus, the method according to a second aspect of the invention makes it possible to obtain a 3D memory in which each memory point is associated with a selector. A first step of selective etching of the plurality of first layers of a conductive material is taken to mean that during this etching step the rate of etching of the plurality of first layers of a conductive material is greater, preferably much greater, than the rate of etching of the plurality of first layers of an insulating material. In addition, it is permitted, during manufacture, to control the geometry of the proximal end of the flat electrode and thus the selector and the floating electrode that are associated therewith.

Advantageously, the first material of the first sub-layer and the third material of the third sub-layer are etched at a rate slower than the rate at which the second material of the second sub-layer is etched during the first step of selective etching of the plurality of first layers of a conductive material.

Thus, the proximal end of the first sub-layer and the proximal end of the third sub-layer are closer to the vertical electrode than the proximal end of the second sub-layer so as to form an indentation, a part of the floating electrode then being able to be inserted into said indentation.

Advantageously, the first material of the first sub-layer and the third material of the third sub-layer are etched at a rate faster than the rate at which the second material of the second sub-layer is etched during the first step of selective etching of the plurality of first layers of a conductive material.

Thus, the proximal end of the first sub-layer and the proximal end of the third sub-layer are further away from the vertical electrode than the proximal end of the second sub-layer so as to form a protuberance, the first active material then being able to adopt the shape of a lying down H.

A third aspect of the invention relates to a second method for manufacturing a 3D memory comprising:
  a first step of deposition of a first layer of a first insulating material;
  a second step of deposition of a second layer of a second insulating material on the first layer of a first insulating material;
the first step of deposition of a first layer of a first insulating material and the second step of deposition of a second layer of a second insulating material being repeated so as to obtain a plurality of first layers of a first insulating material and a plurality of second layers of a second insulating material.

The method according to a third aspect of the invention also comprises:
  a first step of anisotropic etching in the plurality of first layers of a first insulating material and in the plurality of second layers of a second insulating material so as to create a first opening;
  a first step of selective etching of the plurality of second layers of a second insulating material;
  a third step of deposition of a first layer of a conductive material;
  a second step of anisotropic etching of the first layer of a conductive material;
  a fourth step of conformal deposition of a second layer of a second active material;
  a fifth step of deposition of a second layer of a conductive material;
  a third step of anisotropic etching in the plurality of first layers of a first insulating material and in the plurality of second layers of a second insulating material, so as to obtain a second opening taking the form of a trench;
a second step of selective etching of the plurality of second layers of a second insulating material;
a sixth step of conformal deposition of a first layer of a first active material;
a seventh step of deposition of a third layer of a conductive material;
a fourth step of anisotropic etching of the third layer of a conductive material.

Thus, in the same way as the method according to a second aspect of the invention, the method according to a fourth aspect of the invention makes it possible to obtain a 3D memory in which each memory point is associated with a selector.

A fourth aspect of the invention relates to a method for manufacturing a 3D memory comprising:
a first step of deposition of a first layer of a first insulating material;
a second step of deposition of a second layer of a second insulating material on the first layer of a first insulating material;
the first step of deposition of a first layer of a first insulating material and the second step of deposition of a second layer of a second insulating material being repeated so as to obtain a plurality of first layers of a first insulating material and a plurality of second layers of a second insulating material.

The method according to a fourth aspect of the invention also comprises:
a first step of anisotropic etching in the plurality of first layers of a first insulating material and in the plurality of second layers of a second insulating material so as to create a first opening;
a first step of selective etching of the plurality of second layers of a second insulating material;
a third step of conformal deposition of a first layer of a first active material;
a fourth step of deposition of a first layer of a conductive material;
a second step of anisotropic etching of the first layer of a conductive material and the first layer of a first active material;
a fifth step of conformal deposition of a second layer of a second active material;
a sixth step of deposition of a second layer of a conductive material;
a third step of anisotropic etching in the plurality of first layers of a first insulating material and in the plurality of second layers of a second insulating material, so as to obtain a second opening taking the form of a trench;
a second step of selective etching of the plurality of second layers of a second insulating material;
a seventh step of deposition of a third layer of a conductive material;
a fourth step of anisotropic etching of the third layer of a conductive material.

Thus, in the same way as the method according to a second or a third aspect of the invention, the method according to a fourth aspect of the invention makes it possible to obtain a 3D memory in which each memory point is associated with a selector.

The invention and the different applications thereof will be better understood on reading the description that follows and by examining the figures that accompany it.

BRIEF DESCRIPTION OF THE FIGURES

The figures are presented for illustrative purposes and in no way limit the invention.

DETAILED DESCRIPTION OF AT LEAST ONE EMBODIMENT OF THE INVENTION

Unless stated otherwise, a same element appearing in the different figures has a single reference.

Figure 1A:
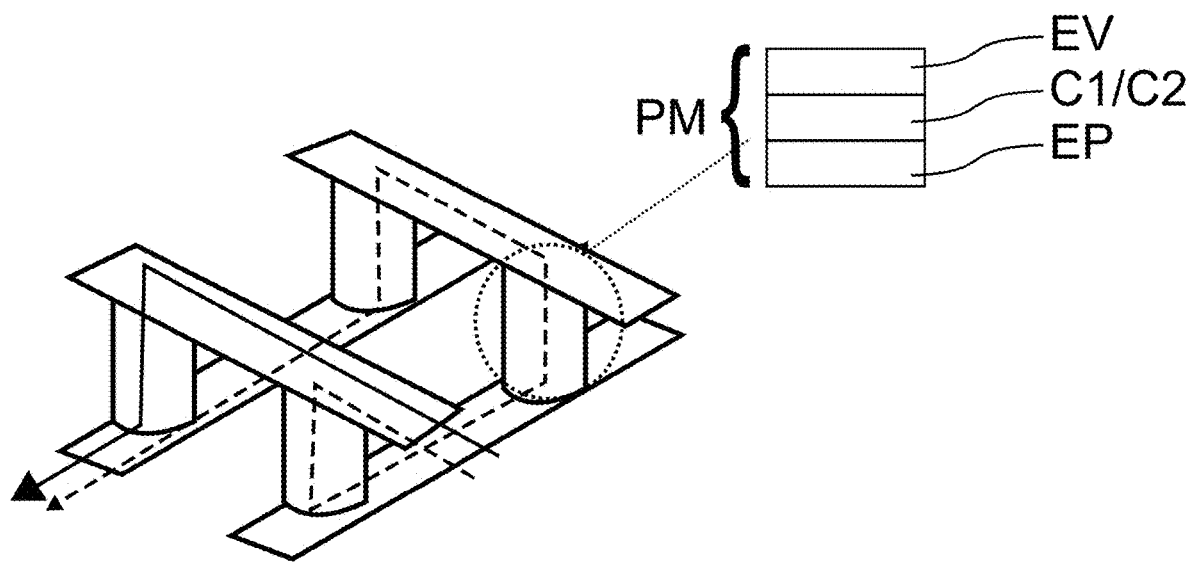
FIG. 1 shows a schematic representation of a 2D memory device without (FIG. 1A) and with (FIG. 1B) selector.
Figure 1B:
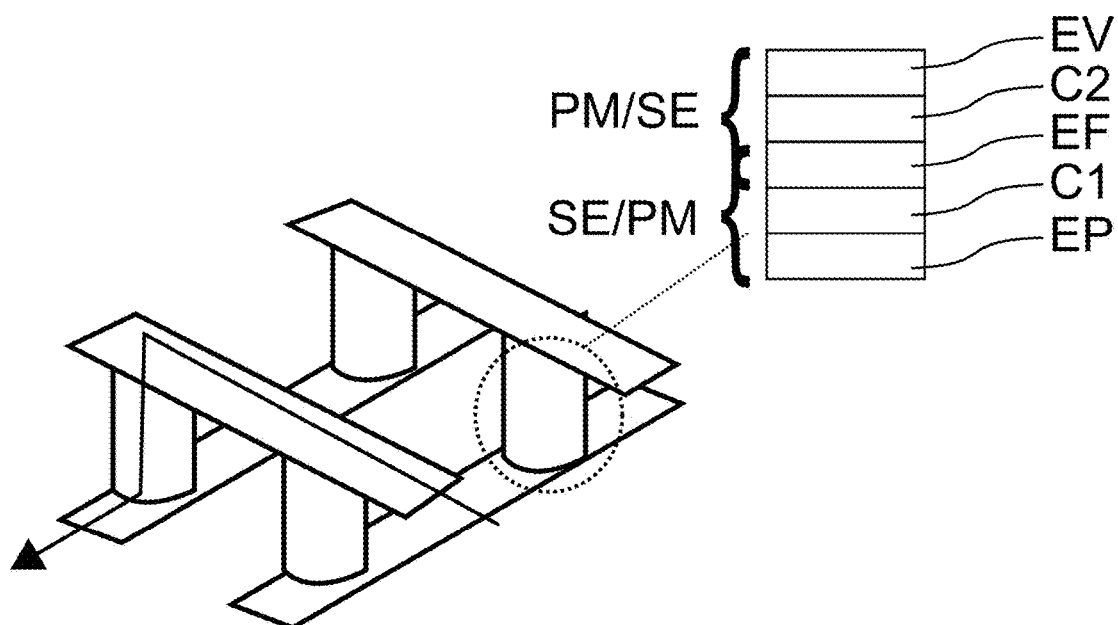
Figure 2:
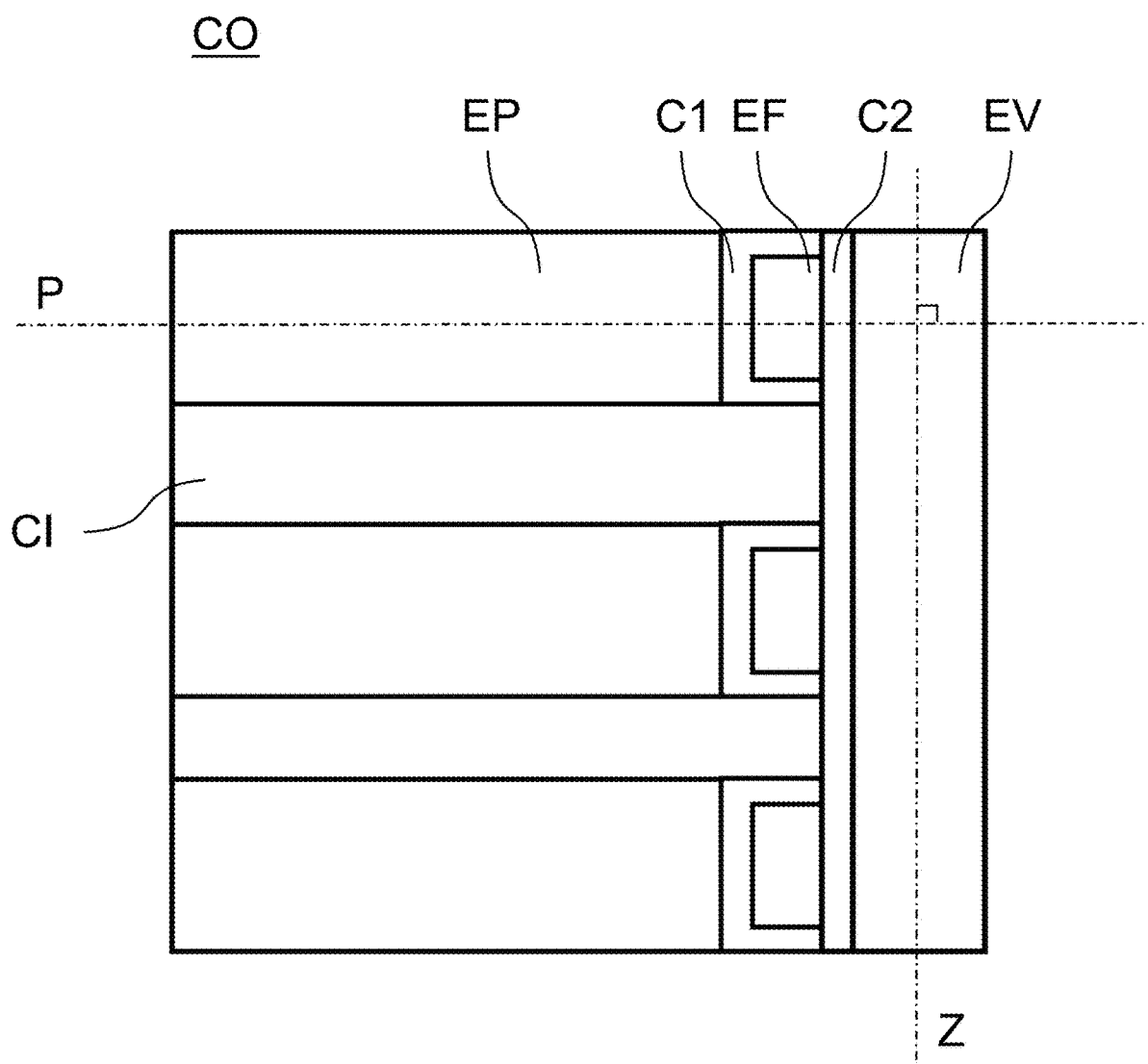
FIG. 2 shows a schematic representation of a memory device according to a first embodiment of a first aspect of the invention.

A first aspect of the invention illustrated in FIGS. 2 to 4 relates to a 3D memory CO comprising a plurality of memory points PM and a plurality of selectors, each memory point of the plurality of memory points being associated with a selector of the plurality of selectors. More particularly, in an embodiment, the 3D memory CO according to a first aspect of the invention comprises a plurality of first electrodes EP made of a conductive material, referred to as flat electrodes EP, each flat electrode EP of the plurality of flat electrodes EP defining a plane P. The memory also comprises a second electrode made of a conductive material, referred to as vertical electrode EV, extending essentially along an axis perpendicular to the plane defined by each flat electrode EP of the plurality of flat electrodes EP. The 3D memory according to a first aspect of the invention also comprises a plurality of third electrodes EF, referred to as floating electrodes, made of a conductive material, each floating electrode EF of the plurality of floating electrodes EF being situated between a flat electrode EP of the plurality of flat electrodes EP and the vertical electrode EV. In other words, each floating electrode EF of the plurality of floating electrodes EF is associated with one and one only single flat electrode EP of the plurality of flat electrodes EP. The conductive materials of the vertical electrode EV, the flat electrode EP and the floating electrode EF may be chosen from TiN, TaN, TaCN, Ta, Ti, W, Cu, Al and/or Ag. The 3D memory according to the invention also comprises a plurality of first layers CI of an insulating material, each flat electrode EP of the plurality of flat electrodes EP being separated from the preceding and/or following flat electrode EP by a first layer CI of an insulating material of the plurality of first layers CI of an insulating material. The memory also comprises a plurality of first layers C1 of a first active material, each layer C1 of a first active material of the plurality of layers C1 of an active material separating a flat electrode of the plurality of flat electrodes EP from the floating electrode that is associated therewith. The 3D memory according to the invention also comprises a second layer C2 of a second active material separating the vertical electrode EV from each floating electrode EF of the plurality of floating electrodes EF. In other words, each flat electrode EP is separated from the floating electrode EF that is associated therewith by a first layer C1 of a first active material, each floating electrode EF of the plurality of floating electrodes EF is separated from the vertical electrode EV by a second layer C2 of a second active material and each flat electrode EP of the plurality of flat electrodes EP is separated from the adjacent flat electrodes EP by a layer CI of an insulating material, referred to as insulating layer CI.

In addition, the first active material constituting the first layer C1 of an active material is capable of forming a selector SE (respectively, a memory point PM) and the second active material constituting the second layer C2 of an active material is capable of forming a memory point PM (respectively, a selector SE). In other words, when the first active material is chosen so as to form a memory point PM then the second active material is chosen so as to be able to form a selector SE. In the same way, when the first active material is chosen so as to form a selector SE then the second active material is chosen so as to be able to form a memory point PM. The material used to obtain a selector may notably comprise $VO_x$, GeSe, $TiO_x$, $Ta_xO_y$. The material used to obtain a memory point may notably comprise $HfO_x$, $Al_xO_y$, $Ta_xO_y$, CuTeGe, GST, $TiO_x$, $SiO_x$. For example, the first active material (respectively the second active material) is GeSe whereas the second active material (respectively the first active material) is GST (GeSbTe). The vertical electrode EV is preferably of cylindrical shape, even more preferentially, a straight circular cylinder. As a reminder, a cylinder is a ruled surface of which the generatrixes are parallel. The width (or the diameter for the straight circular cylinder) of the vertical electrode EV is limited by the height of said cylinder and the manufacturing methods used. In particular, the maximum form aspect allowed by a given method will make it possible to know the minimum diameter of the vertical electrode EV as a function of the height of the latter. Thus, a plurality of memory points PM is obtained each comprising a selector SE. Hereafter, memory point PM is taken to mean the assembly constituted by two electrodes (for example the flat electrode EP and the floating electrode EF or the floating electrode EF and the vertical electrode EV) surrounding an active material (for example the first layer C1 of a first active material or the second layer C2 of a second active material) capable of forming a memory point PM. Similarly, selector SE is taken to mean the assembly constituted by two electrodes surrounding an active material capable of forming a selector SE.

Preferentially, in order to decrease capacitive coupling between the flat electrodes EP of the plurality of flat electrodes EP, the thickness of the layer CI of an insulating material is comprised between 20 and 40 nm. Preferably, the thickness of the insulating layer CI is made of $SiO_2$ in order to benefit from its low permittivity. As illustrated in FIGS. 2 to 4, the insulating layer CI also separates the structure formed by the floating electrode EF and the first layer C1 of an active material associated with a flat electrode EP from identical structures associated with the adjacent flat electrodes EP.

In an embodiment illustrated in FIGS. 3 and 4, each flat electrode EP comprises a first sub-layer EP1 made of a first conductive sub-layer material, a second sub-layer EP2 made of a second conductive sub-layer material and a third sub-layer EP3 made of a third conductive sub-layer material. Preferably, the conductive materials of the first sub-layer EP1 and the third sub-layer EP3 are identical. As will be detailed hereafter, this sub-layer structure makes it possible to modulate the shape of the end of the flat electrode EP. By varying this shape, it is notably possible to vary the surface of the flat electrode EP facing the floating electrode EF that is associated therewith with respect to the surface of said floating electrode EF facing the vertical electrode EV so as to take account of the differences in conductivity between the first layer C1 of a first active material and the second layer C2 of a second active material. For example, the shape of the flat electrode EP is chosen such that:

$$S_{EP/EF}\rho_{C1}=S_{EF/EV}\rho_{C2}$$

where $S_{EP/EF}$ is the surface of the flat electrode EP facing the floating electrode EF that is associated therewith, $S_{EF/EV}$ is the surface of said floating electrode EF facing the vertical electrode EV, $\rho_{C1}$ is the conductivity of the first active material and $\rho_{C2}$ is the conductivity of the second active material.

Figure 3A:
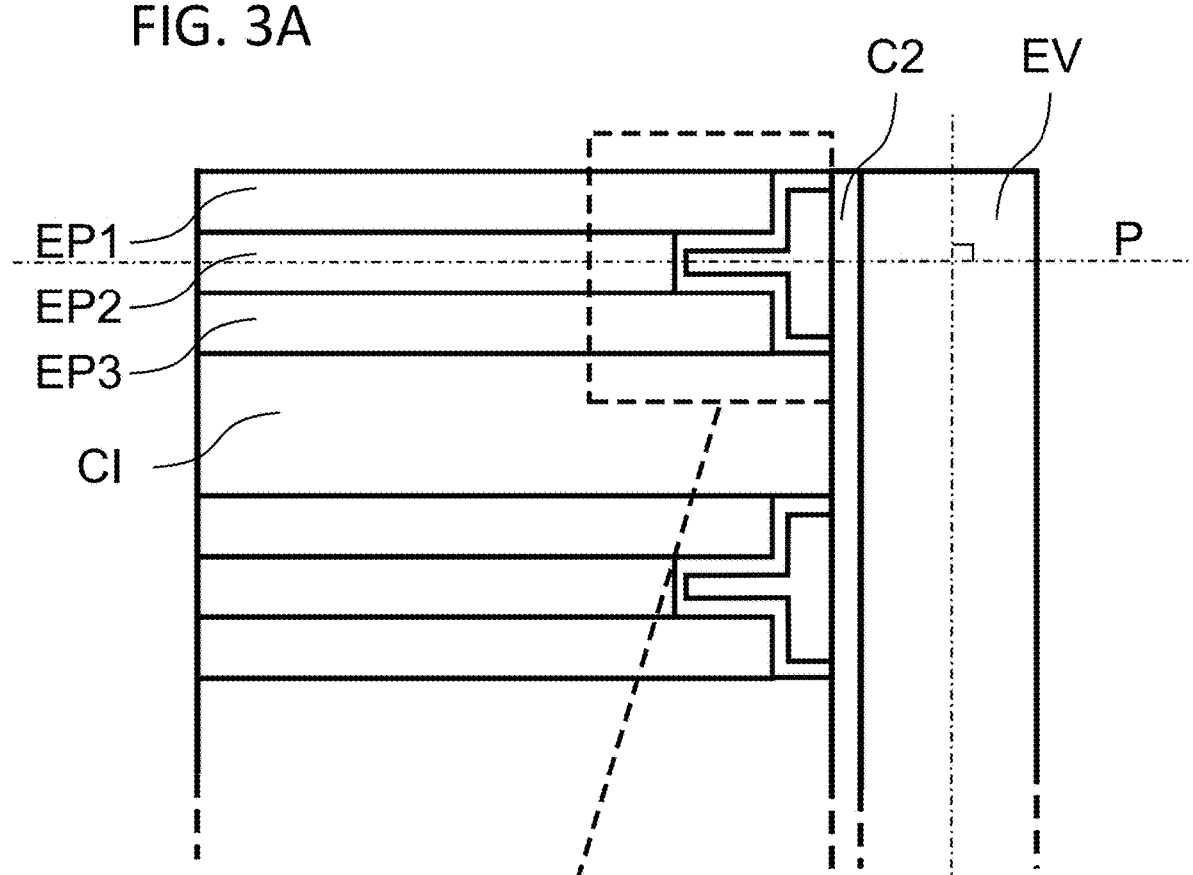
FIG. 3 shows a schematic representation of a memory device according to a second embodiment of a first aspect of the invention.
Figure 3B:
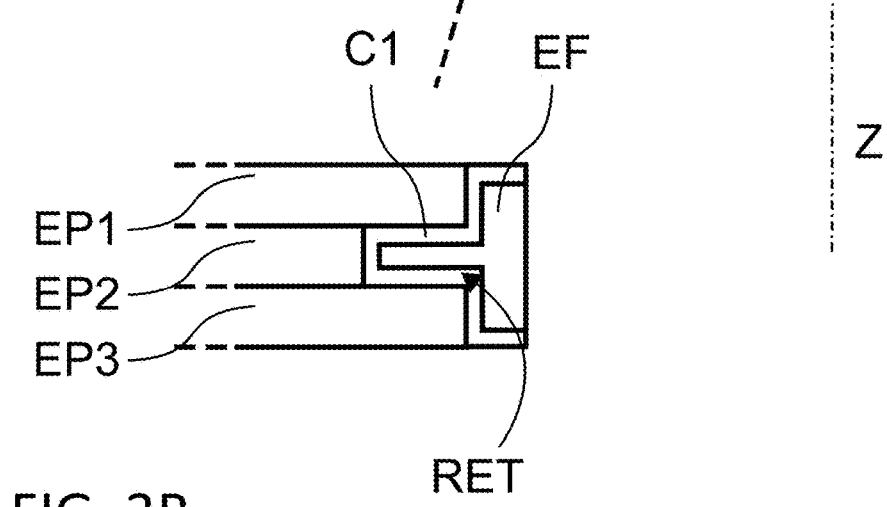

In an embodiment illustrated in FIGS. 3A and 3B, for each flat electrode EP of the plurality of flat electrodes EP, the proximal end of the first sub-layer EP1 and the proximal end of the third sub-layer EP3 are closer to the vertical electrode EV than the proximal end of the second sub-layer EP2 so as to form an indentation RET, a part of the floating electrode EF associated with the considered flat electrode EP being inserted into said indentation RET. The floating electrode EF may for example adopt the shape of a lying down T such that the part of the floating electrode EF corresponding to the foot of the T shape is inserted into the indentation RET. It will be noted that, in this configuration, the height of the floating electrode EF facing the vertical electrode EV is greater than the height of the floating electrode EF facing the second layer EP2 of the flat electrode EP. The active material of the first layer C1 of an active material is preferentially a material capable of forming a memory point. Thus, it is possible to benefit from the reversed T shape and in particular from the point effect occurring at the end of the floating electrode EF facing the second layer EP2 of the flat electrode EP, for example to facilitate the formation of a filament enabling the storage of information.

Figure 4A:
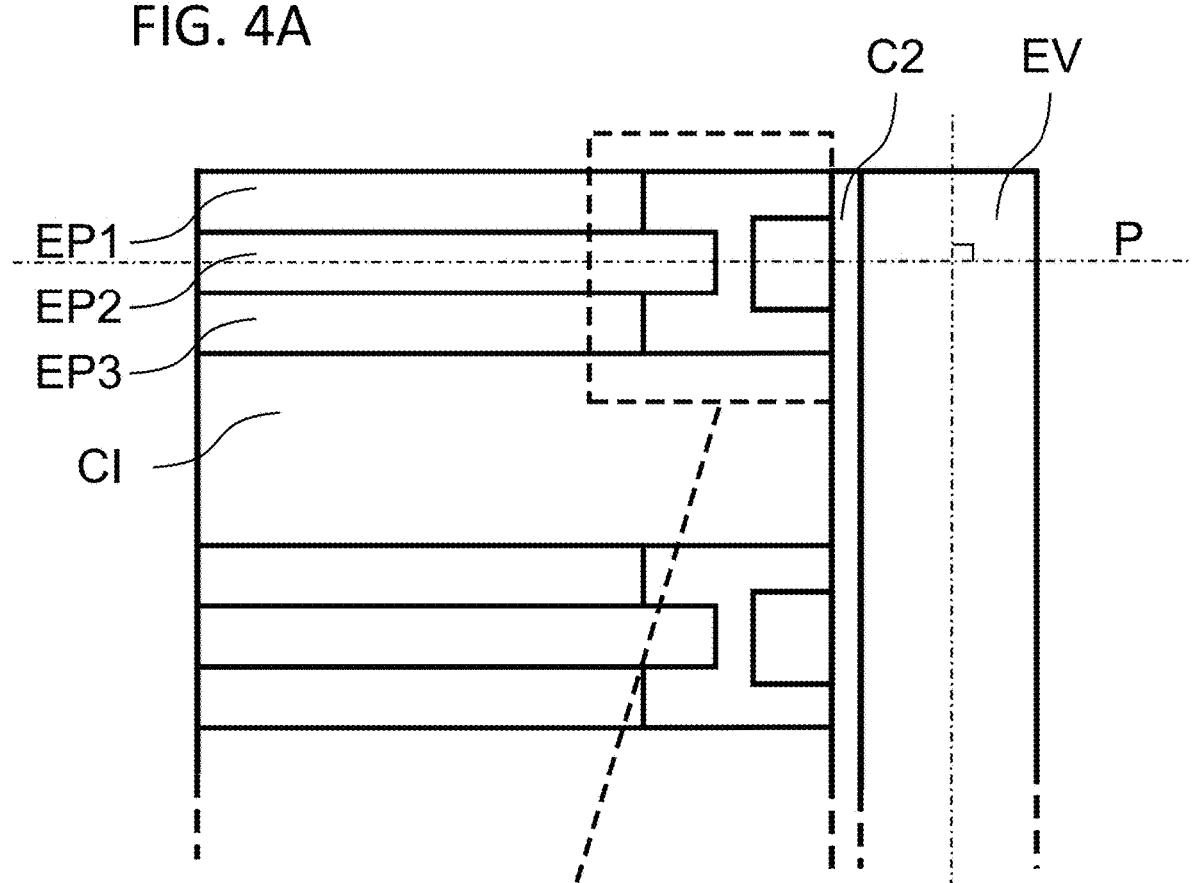
FIG. 4 shows a schematic representation of a memory device according to a third embodiment of a first aspect of the invention.
Figure 4B:
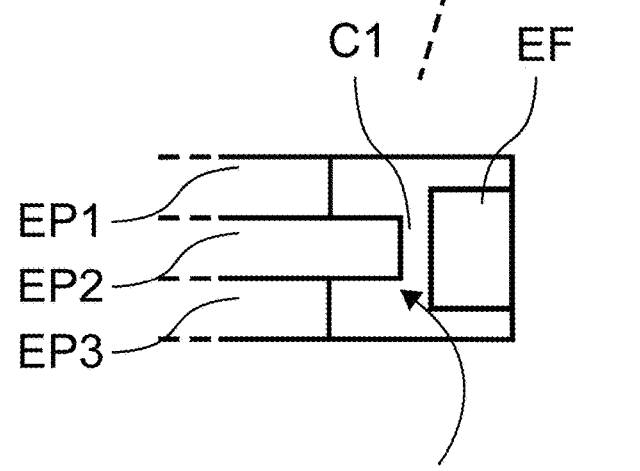
Figure 5:
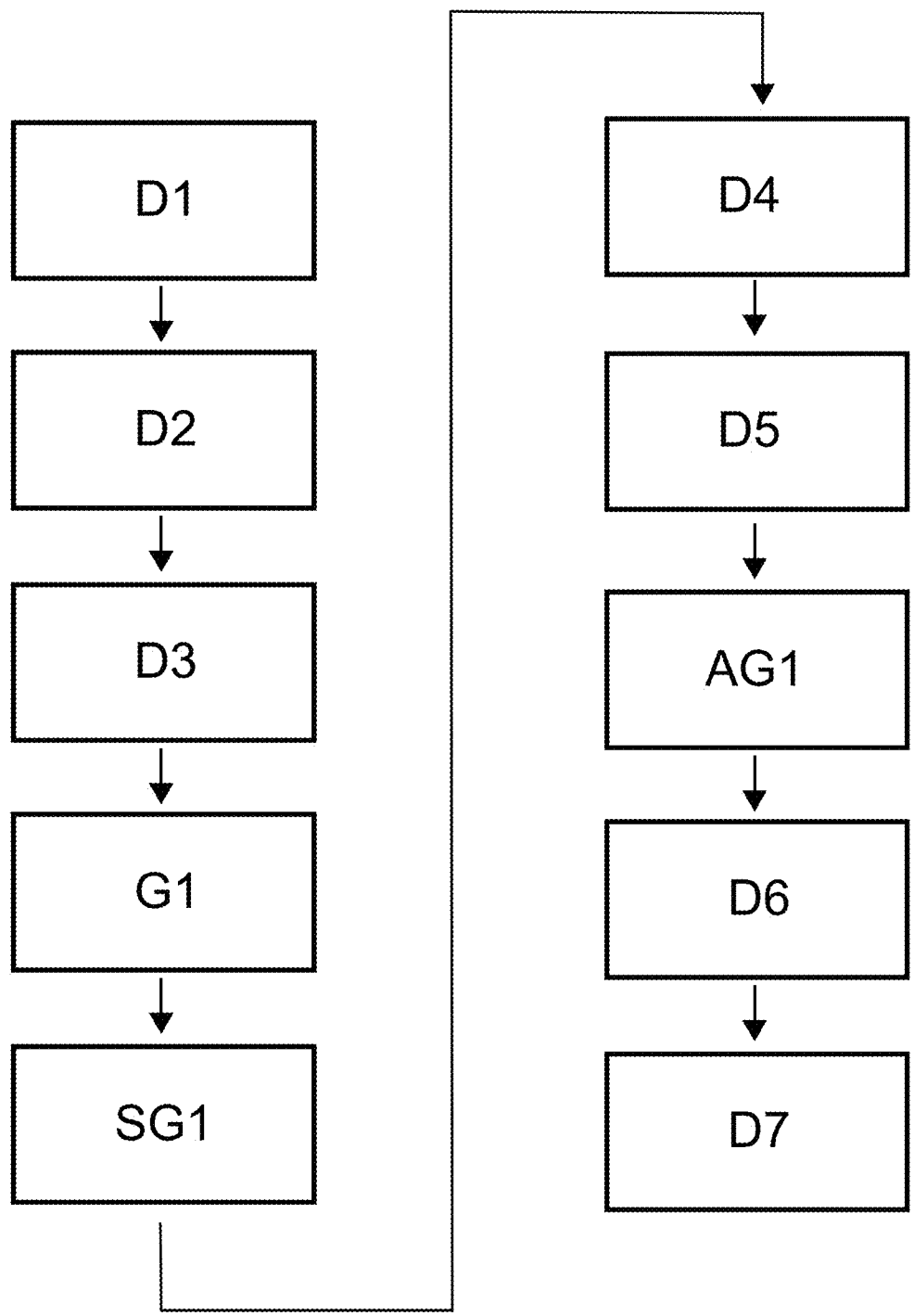
FIG. 5 shows a logic diagram of a manufacturing method according to a second aspect of the invention.

In an alternative embodiment illustrated in FIGS. 4A and 4B, for each flat electrode EP of the plurality of flat electrodes EP, the proximal end of the first sub-layer EP1 and the proximal end of the third sub-layer EP3 are further away from the vertical electrode EV than the proximal end of the second sub-layer EP2 so as to form a protuberance PRT. Preferentially, the thickness of the floating electrode EF associated with the considered flat electrode EP is greater than the thickness of the second sub-layer EP2 of the flat electrode EP. Thus, the end of the flat electrode EP is thinned which makes it possible to favour the heating of said end, and thus has an advantage when the memory point PM is a phase change memory point PM.

In order to obtain such a memory CO, a second aspect of the invention illustrated in FIGS. 5 to 9 relates to a method PRO for manufacturing a 3D memory. As illustrated in FIGS. 7A and 8A, the method PRO according to the invention comprises a first step D1 of deposition of a first layer CI of an insulating material. The deposition may for example be carried out on a semiconductor substrate ST, for example a silicon substrate. The insulating material may notably be chosen from SiN and SiO$_x$. As illustrated in FIGS. 7B and 8B, the method PRO also comprises a second step D2 of deposition of a first layer EP of a conductive material on the first layer CI of an insulating material. The conductive material may be notably chosen from TiN, TaN, TaCN, Ta, Ti, W, Cu, Al and/or Ag. As illustrated in FIGS. 7C and 8C, the first step D1 of deposition of a first layer CI of an insulating material and the second step D2 of deposition of a first layer EP of a conductive material are repeated, for example a number N of times to obtain N memory points PM per vertical electrode EV, so as to obtain a plurality of first layers CI of an insulating material and a plurality of first layers EP of a conductive material. As illustrated in FIGS. 7D and 8D, the method PRO according to the invention may advantageously comprise a third step D3 of deposition of a second layer CI of an insulating material on the final first layer EP of a conductive material of the plurality of first layers EP of a conductive material. The insulating material may notably be chosen from SiN and SiO$_x$.

Figures 7A, 7B:
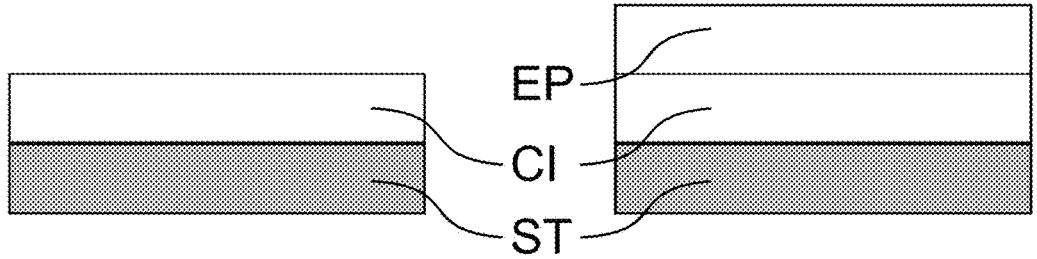
FIG. 7 shows a schematic representation of the different steps of a first embodiment of a method according to a second aspect of the invention.
Figures 7C, 7D:
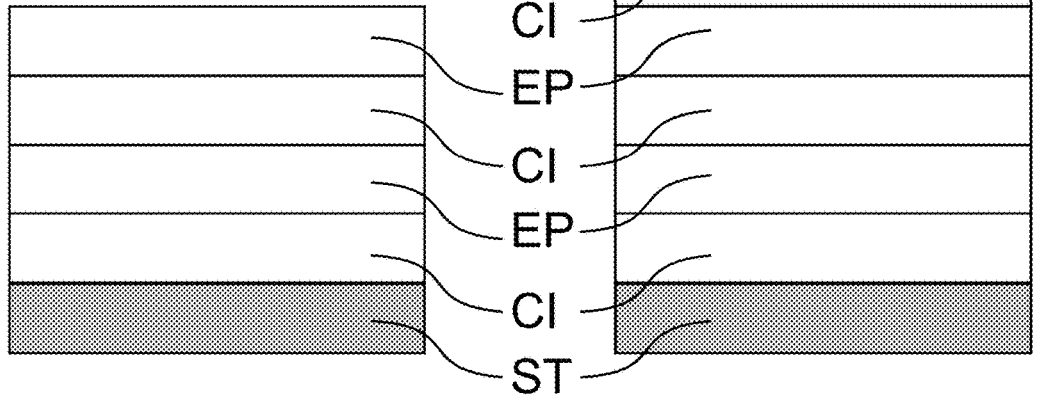
Figure 7E:
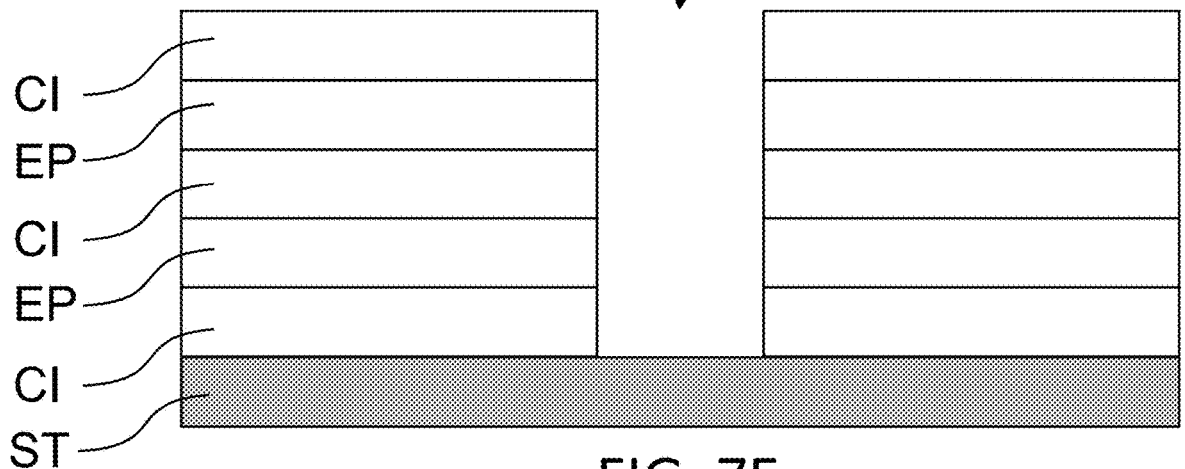

Once the stack illustrated in FIGS. 7D and 8D has been obtained, the method PRO according to the invention also comprises, as illustrated in FIGS. 7E and 8E, a first step AG1 of anisotropic etching in the plurality of first layers CI of an insulating material, in the second layer CI of an insulating material (if the latter exists) and in the plurality of first layers EP of a conductive material so as to obtain an opening OUV. If necessary, this etching may be carried out in several sub-steps, as a function of the materials used for the layers of an insulating or conductive material.

Figure 7F:
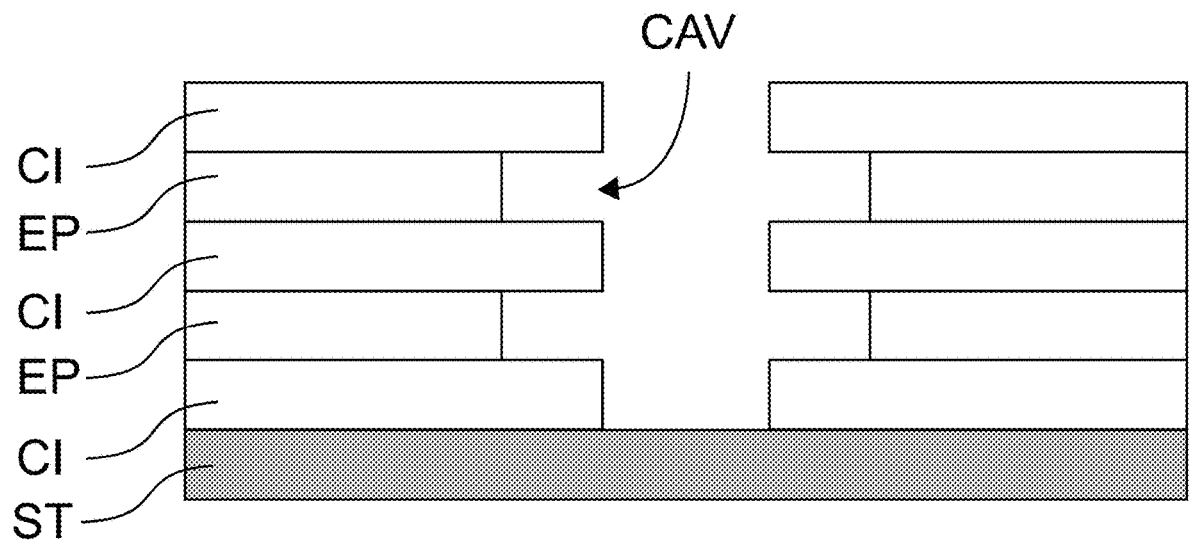
Figure 7G:
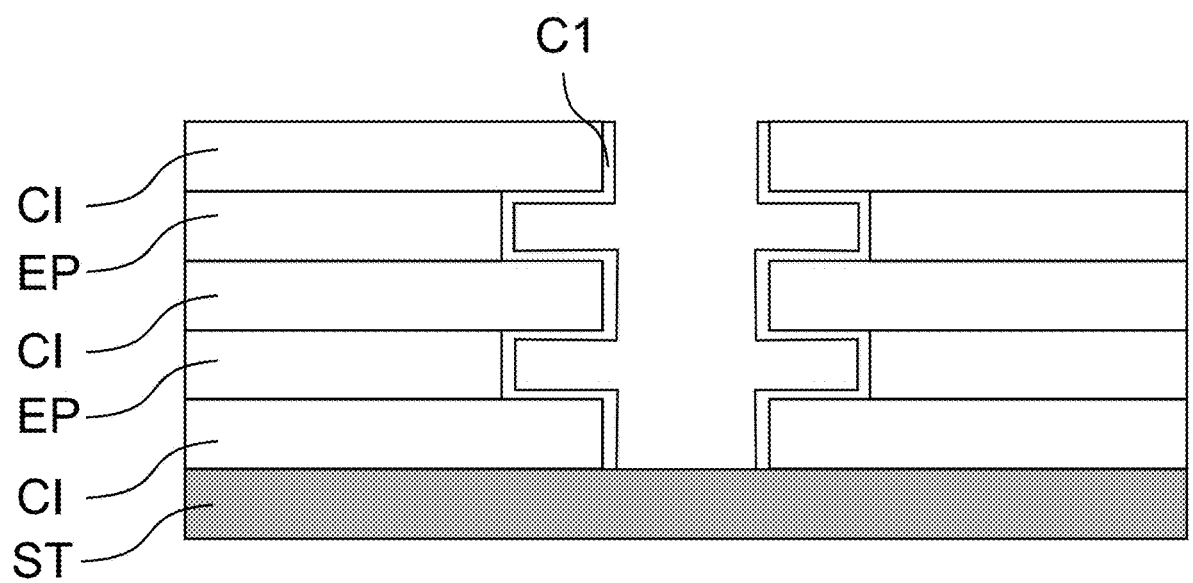
Figure 8F:
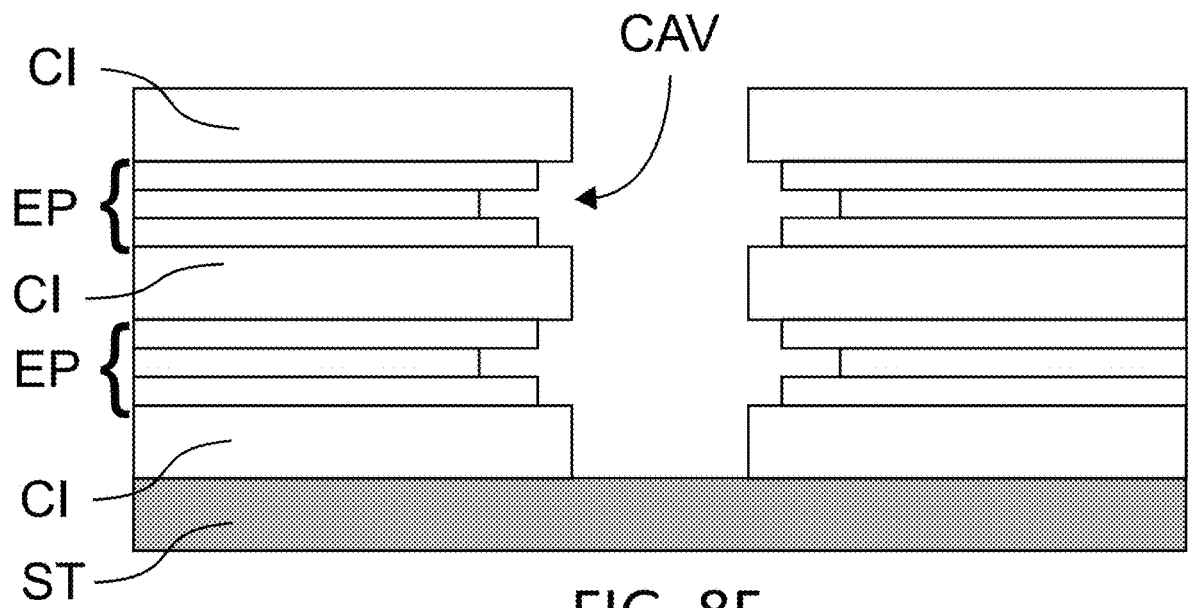
FIG. 8 shows a schematic representation of the different steps of a second embodiment of a method according to a second aspect of the invention.
Figure 8G:
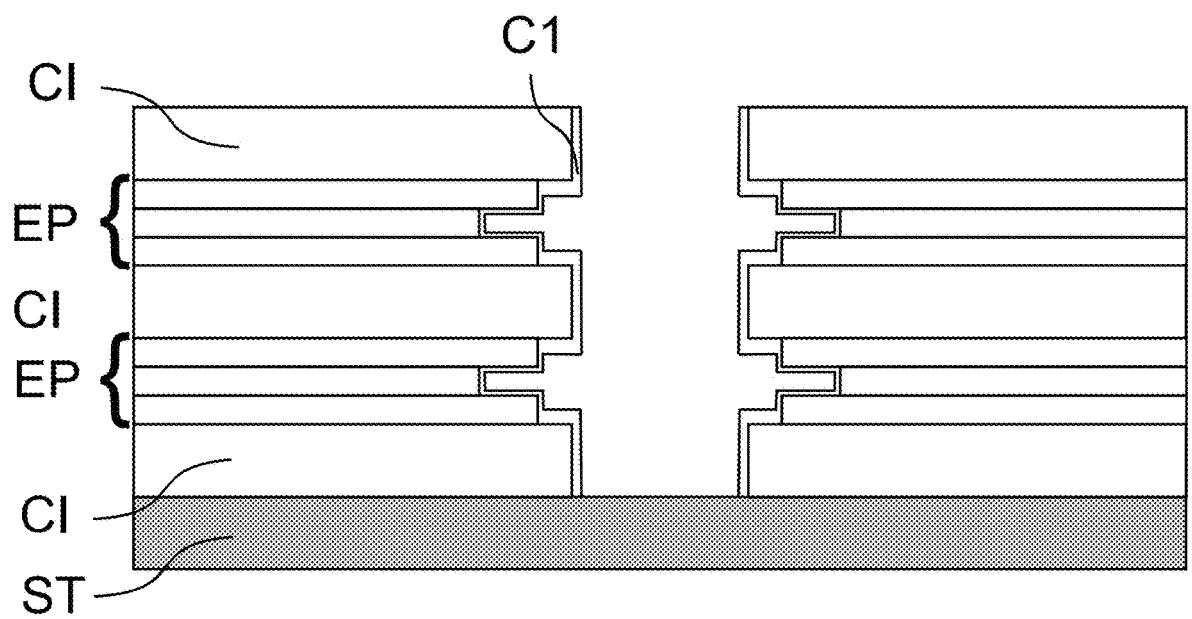
Figure 9A:
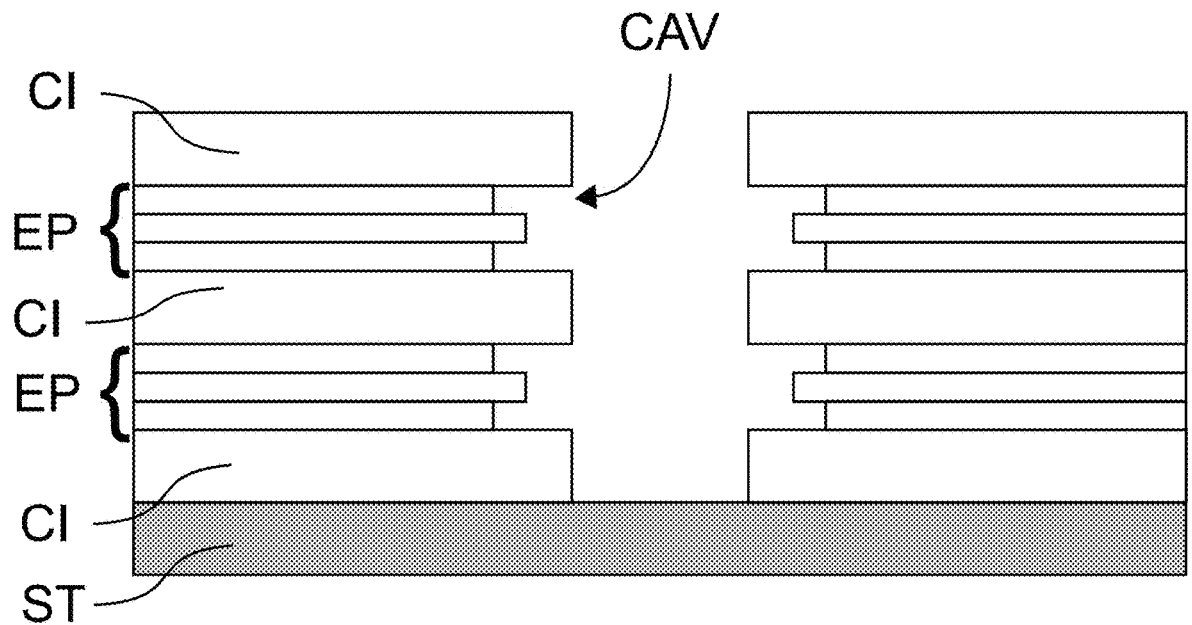
FIG. 9 shows a schematic representation of the different steps of a third embodiment of a method according to a second aspect of the invention.
Figure 9B:
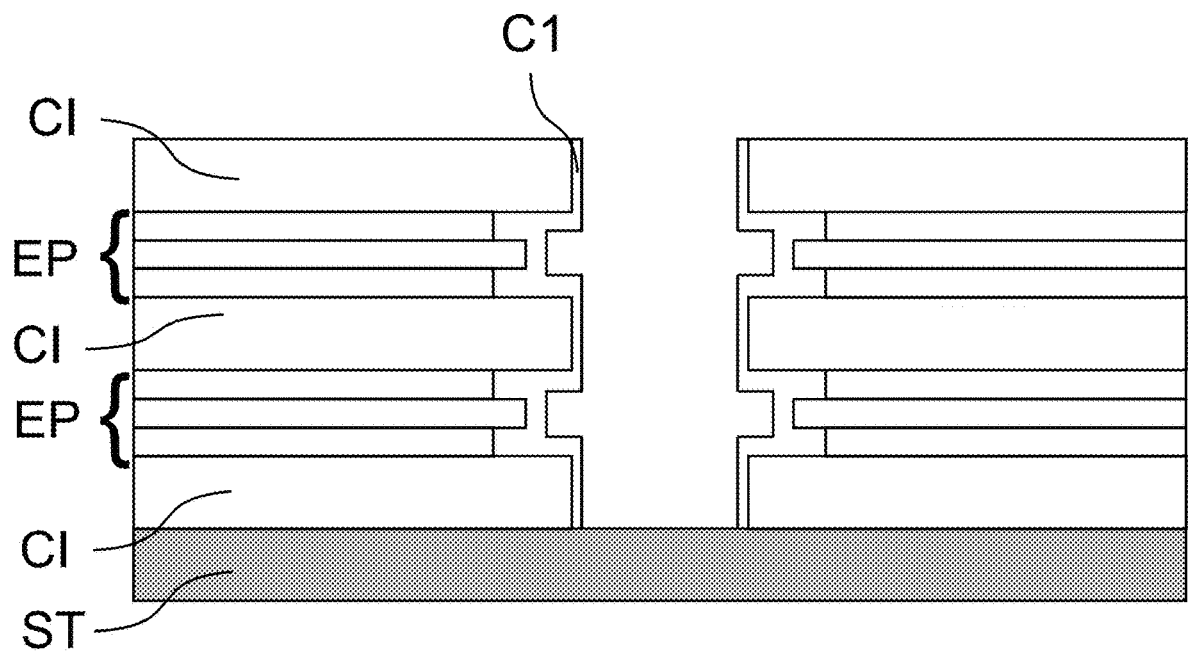

As illustrated in FIGS. 7F, 8F and 9A, the method next comprises a first step SG1 of selective etching of the plurality of first layers EP of a conductive material. The etching being selective, the plurality of first layers CI of an insulating material is etched less quickly than the plurality of first layers EP of a conductive material forming the flat electrode EP such that a cavity CAV is formed at the level of each flat electrode EP. As illustrated in FIGS. 7G, 8G and 9B, the first step SG1 of selective etching is followed by a fourth step D4 of conformal deposition of a first layer C1 of a first active material. When the first active material is intended to play the role of selector, the latter may notably be chosen from VON, GeSe, TiO$_x$ and/or Ta$_x$O$_y$. When this first active material is intended to play the role of memory point, the latter may notably be chosen from HfO$_x$, AlxO$_y$, TaxO$_y$, CuTeGe, GST, TiO$_x$ and/or SiO$_x$.

Figure 7H:
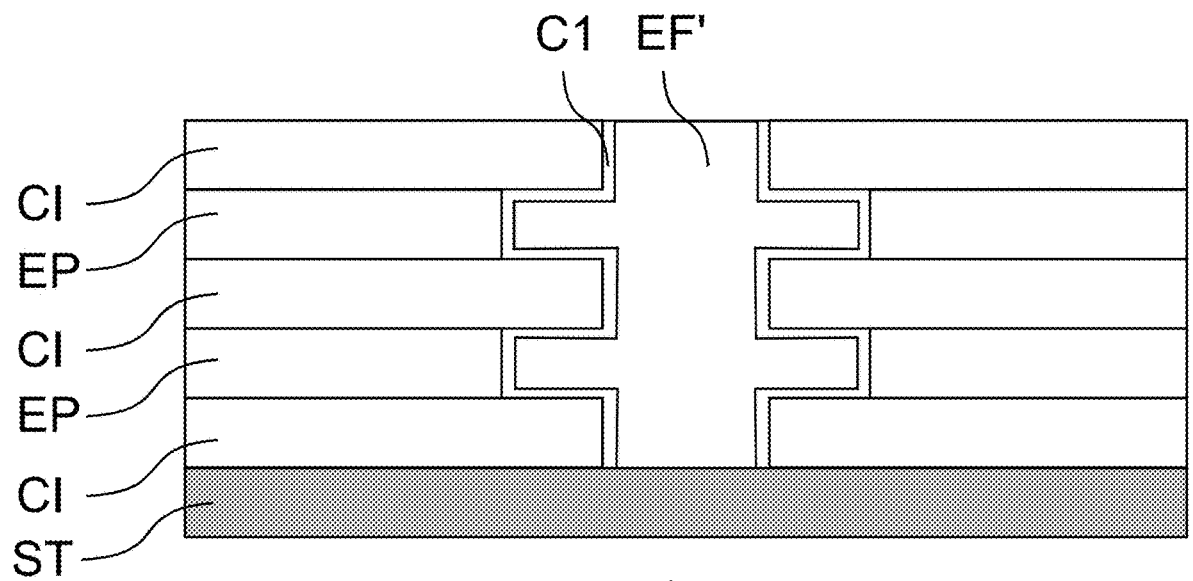
Figure 7I:
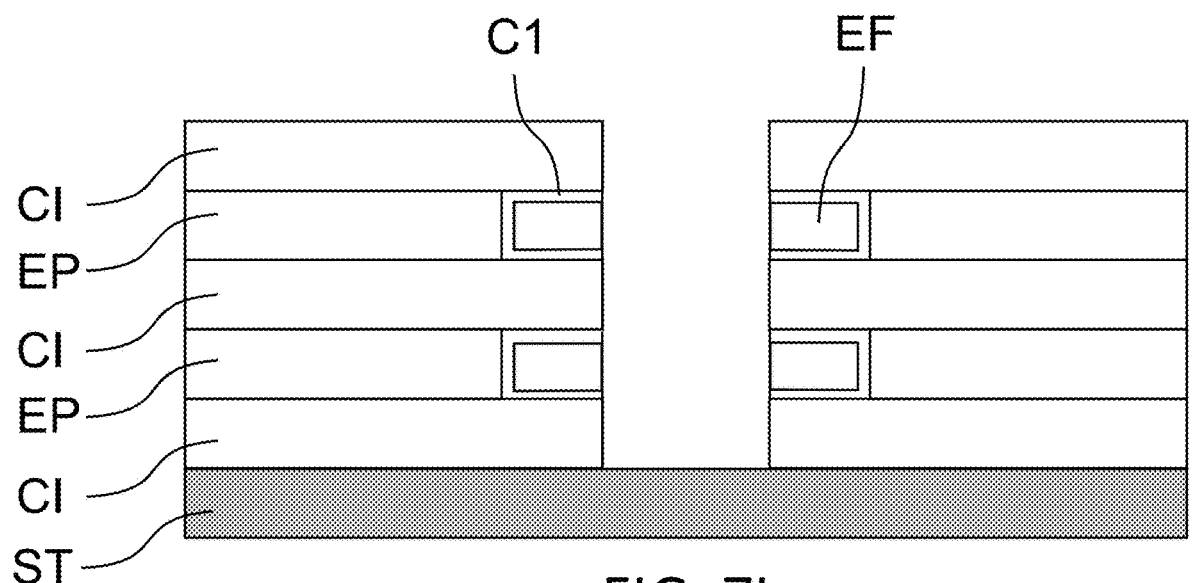
Figure 8H:
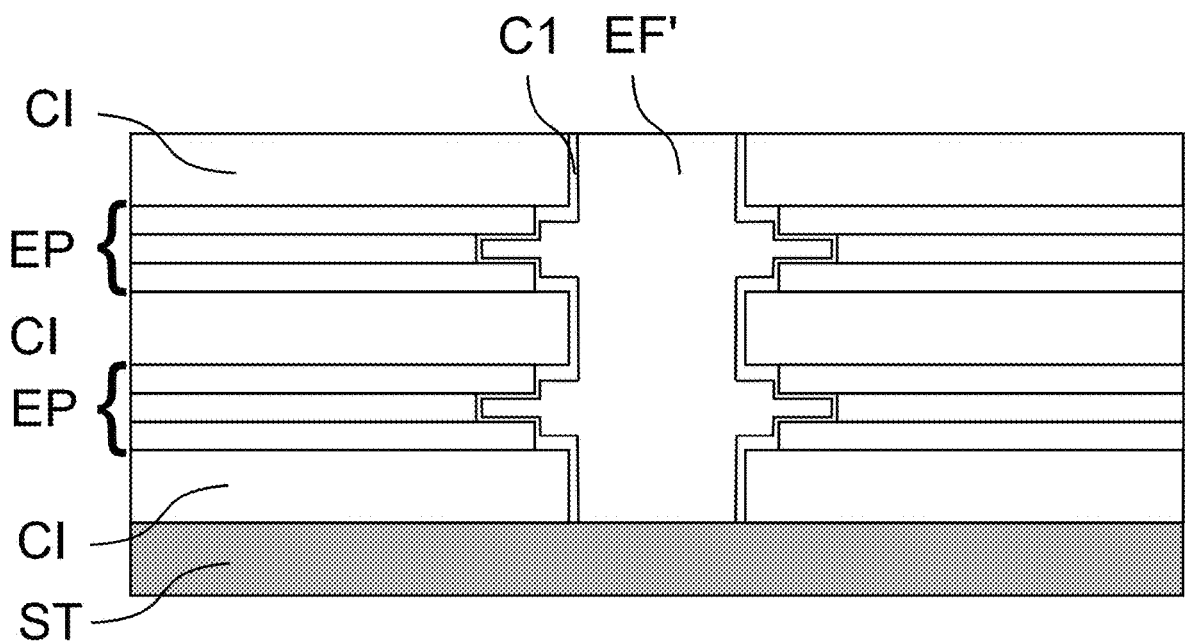
Figure 8I:
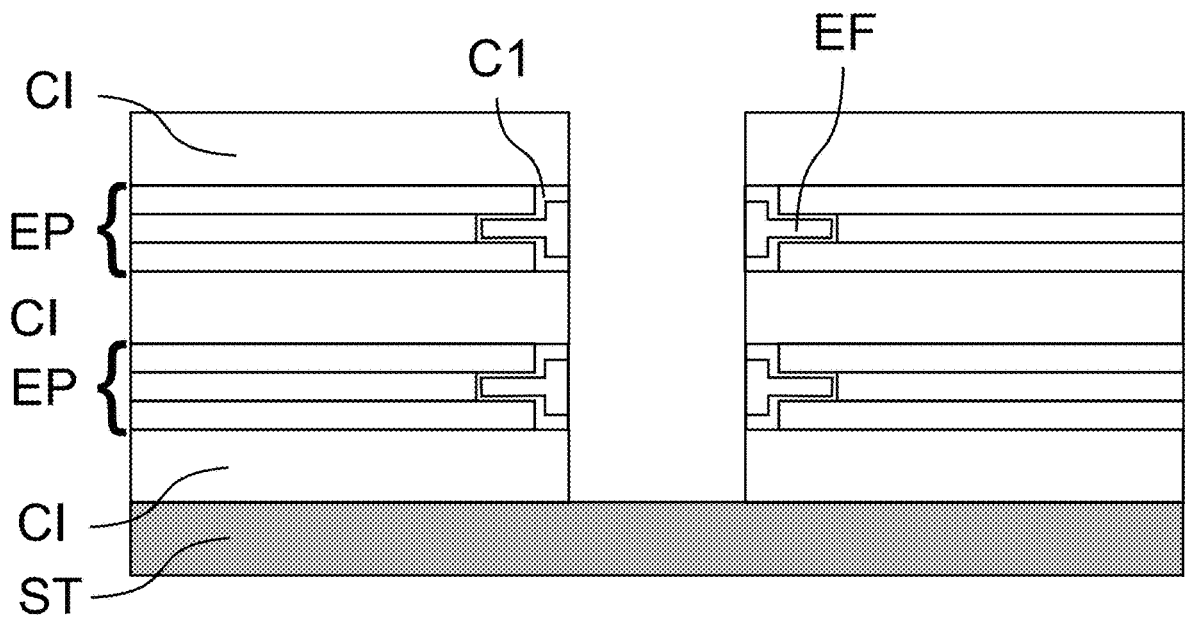
Figure 9C:
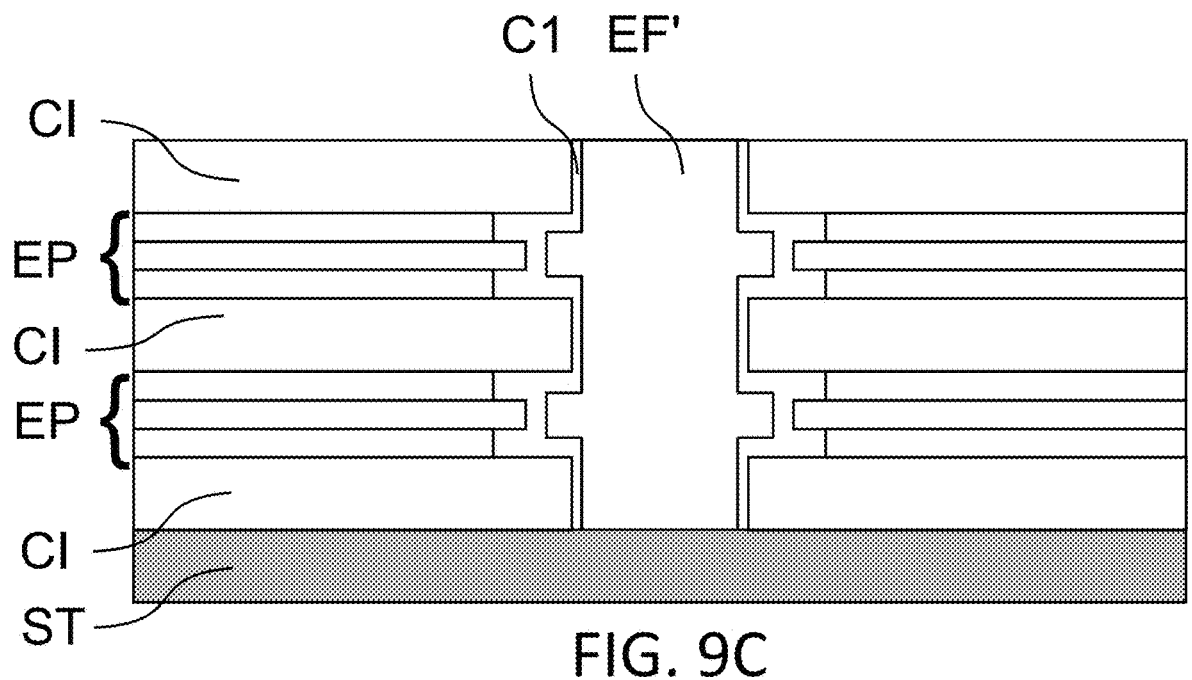
Figure 9D:
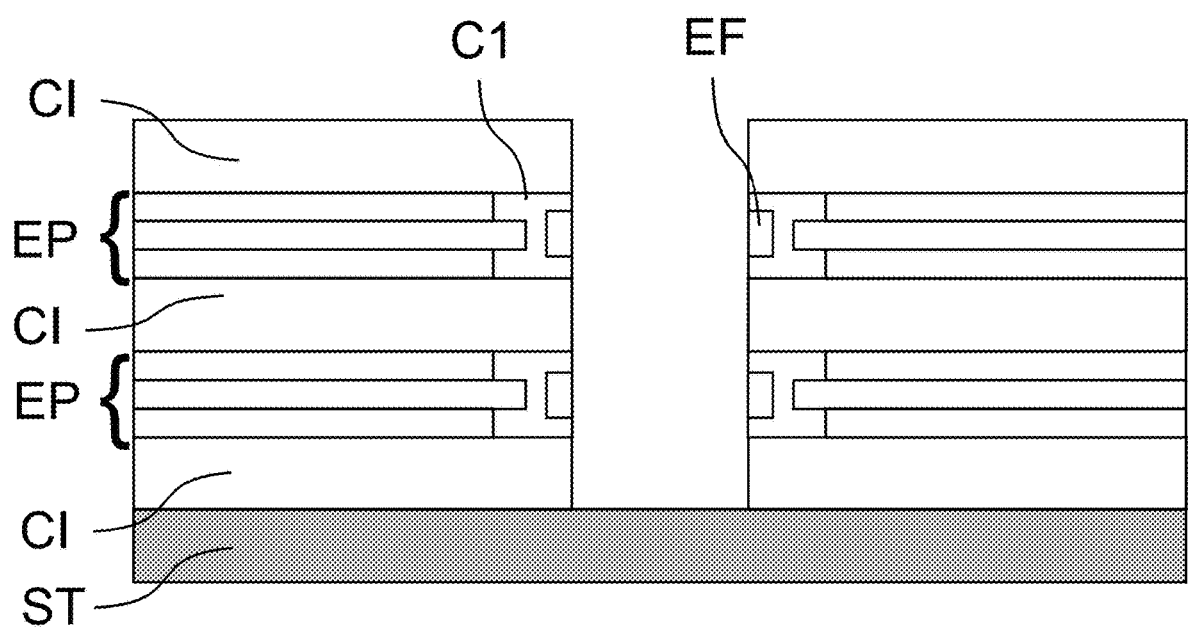

As illustrated in FIGS. 7H, 8H and 9C, the method according to the invention also comprises a fifth step D5 of deposition of a second layer EF' of a conductive material. The conductive material may be chosen from TiN, TaN, TaCN, Ta, Ti, W, Cu, Al and/or Ag. In FIGS. 7H, 8H and 9C, the second layer EF' of a conductive material is represented as filling the totality of the opening OUV obtained during the first step AG1 of anisotropic etching, but this is not an obligation, the second layer EF' of a conductive material having on the other hand to fill the totality of each cavity CAV. As illustrated in FIGS. 7I, 8I and 9D, this step is followed by a second step AG2 of anisotropic etching of the second layer EF' of a conductive material and the first layer C1 of an active material. The anisotropic etching makes it possible to conserve the part of the second layer EF' of a conductive material and the part of the first layer C1 of an active material present in the cavity CAV at the level of each flat electrode EP so as to form, for each flat electrode EP, a floating electrode EF and the active material of the selector SE or the memory point PM.

Figure 7J:
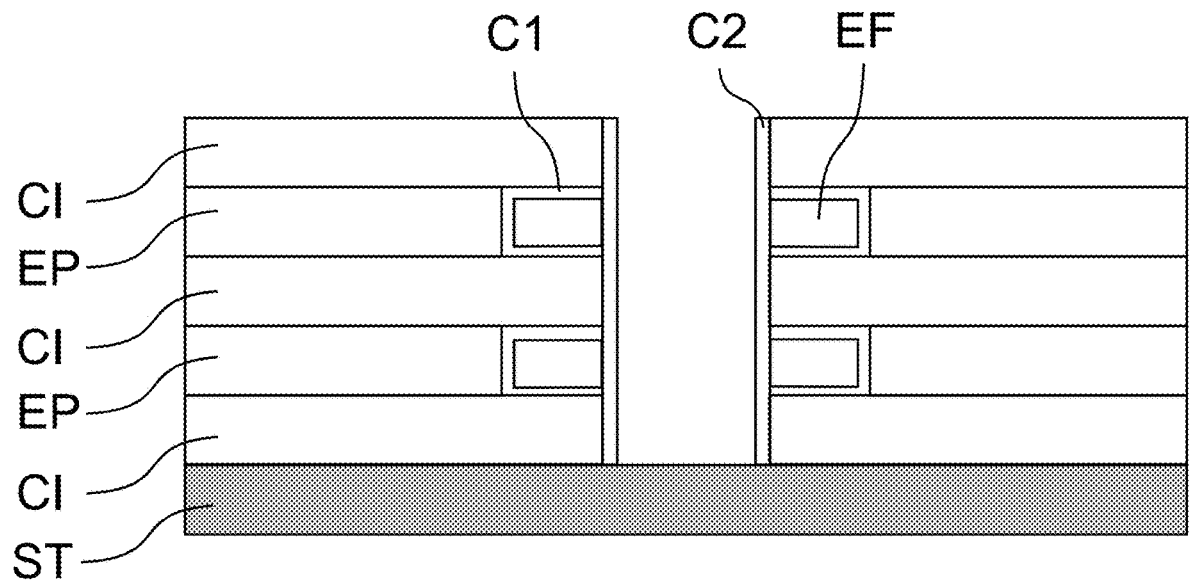
Figure 8J:
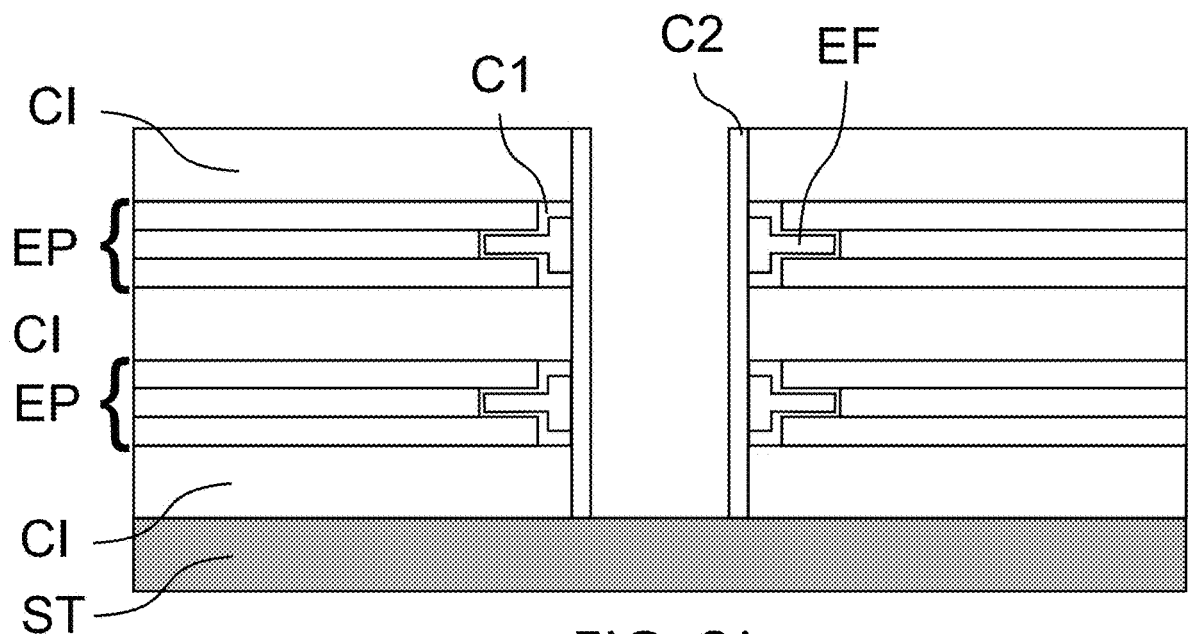
Figure 9E:
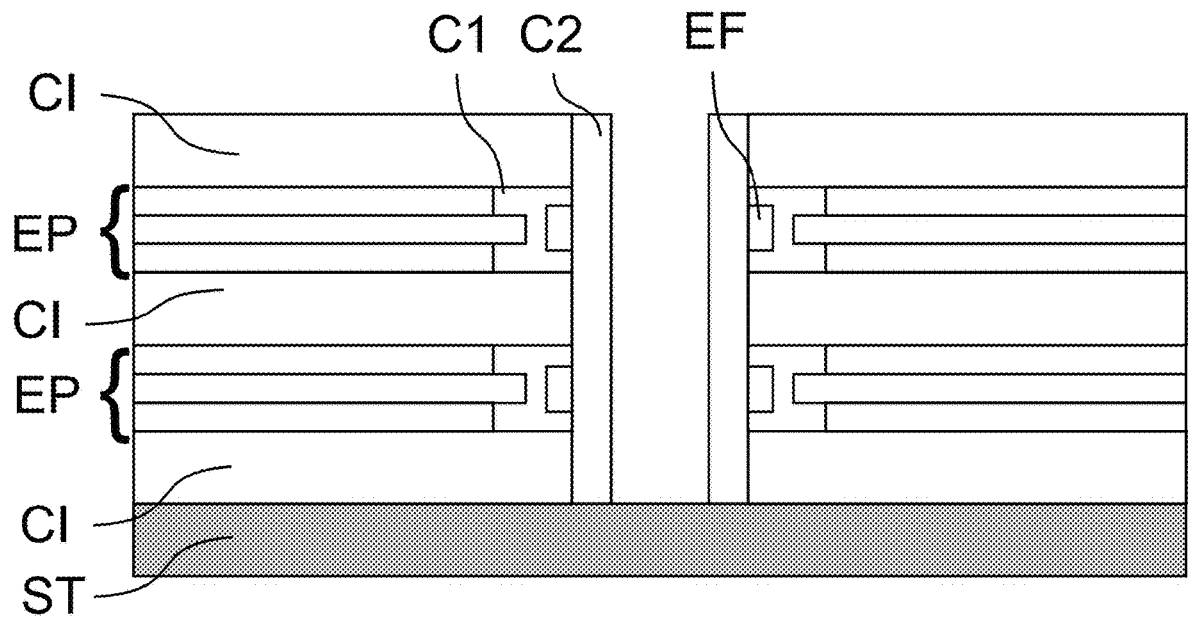

As illustrated in FIGS. 7J, 8J and 9E, the method PRO also comprises a sixth step D6 of conformal deposition of a second layer C2 of a second active material. When the second active material is intended to play the role of selector SE, the latter may notably be chosen from VON, GeSe, TiO$_x$ and/or Ta$_x$O$_y$. When this second active material is intended to play the role of memory point PM, the latter may notably be chosen from HfO$_x$, AlxO$_y$, TaxO$_y$, CuTeGe, GST, TiO$_x$ and/or SiO$_x$. When the conductive material deposited during the fifth step D5 of deposition of a layer EF' of conductive material is a transition metal, then the second active material of the second layer C2 of an active material may be obtained by annealing (by thermal treatment or by plasma) under a controlled atmosphere. For example, if the conductive material deposited during the fifth step D5 of deposition of a layer EF' of conductive material is hafnium, then the second active material of the second layer C2 of an active material is hafnia (hafnium oxide) obtained by annealing (by thermal treatment or by plasma) under a controlled atmosphere rich in oxygen or in ozone. It appears in an obvious manner that when the first layer C1 of a first active material is intended to play the role of selector SE (respectively, memory point PM) then the second layer C2 of a second active material is intended to play the role of memory point PM (respectively, selector SE).

Figure 7K:
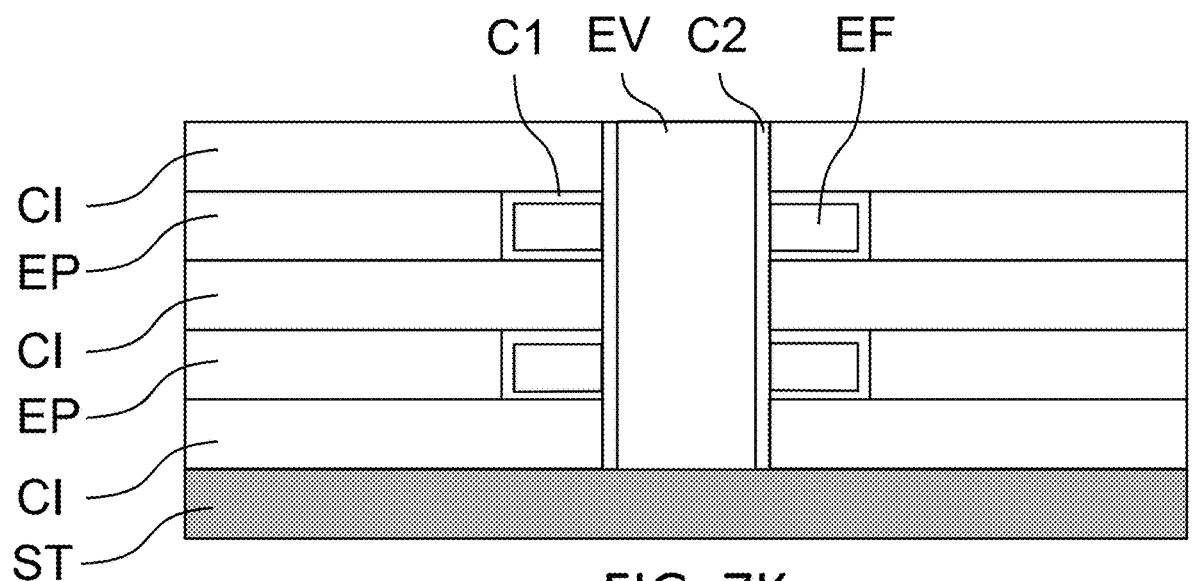
Figure 8K:
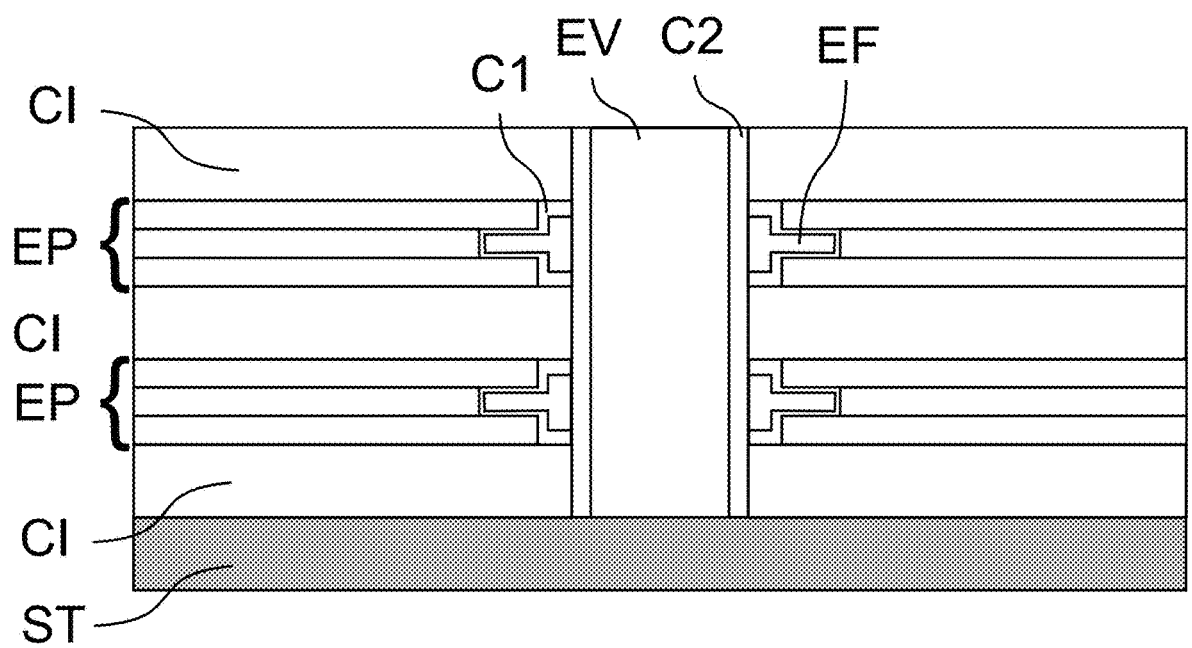
Figure 9F:
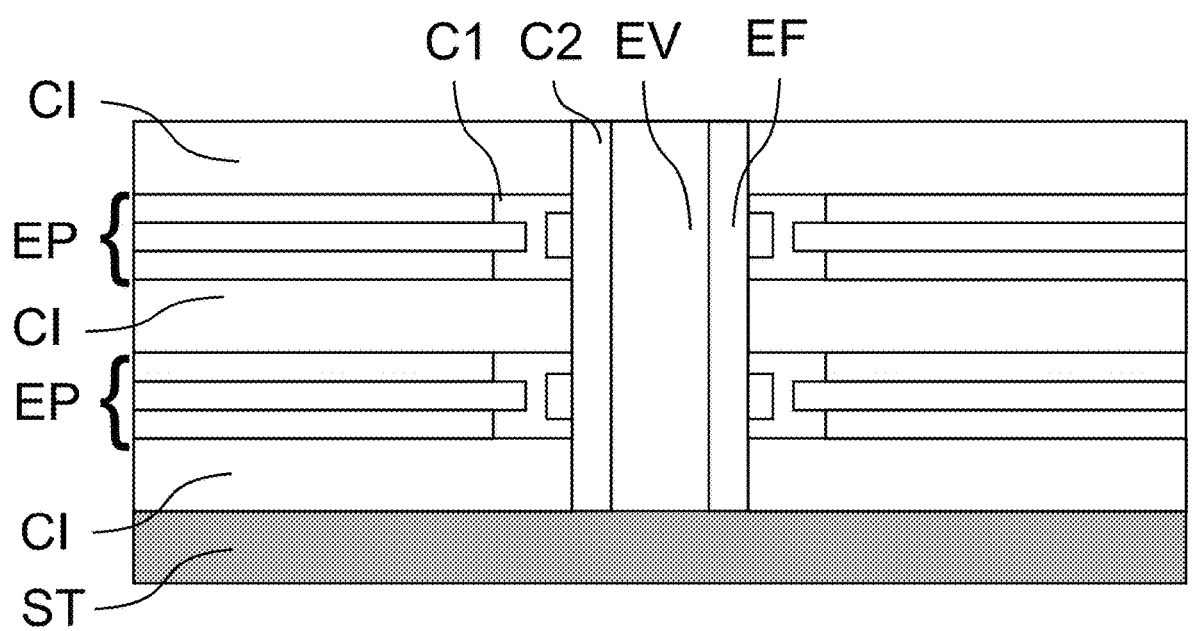

Finally, as illustrated in FIGS. 7K, 8K and 9F, the method further comprises a seventh step D7 of deposition of a third layer EV of a conductive material. The material deposited may notably be chosen from TiN, TaN, TaCN, Ta, Ti, W, Cu, Al and Ag. The 3D memory CO thus obtained comprises a plurality of first electrodes EP, referred to as flat electrodes EP, each flat electrode EP of the plurality of flat electrodes EP defining a plane P; a second electrode EV, referred to as vertical electrode EV, extending essentially along an axis Z perpendicular to the plane PM defined by each flat electrode EP; a plurality of first layers CI of an insulating material, each flat electrode EP of the plurality of flat electrodes EP being separated from the preceding and/or following flat electrode EP by a first layer CI of an insulating material of the plurality of first layers CI of an insulating material. The 3D memory also comprises a plurality of third electrodes EF, referred to as floating electrodes, each floating electrode EF being situated between the flat electrode EP with which it is associated and the vertical electrode EV; a plurality of first layers C1 of a first active material separating each flat electrode EP from the floating electrode EF that is associated therewith; a second layer of a second active material separating the vertical electrode EV from each floating electrode EF of the plurality of floating electrodes EF. Moreover, the first active material is capable of forming a selector SE or a memory point PM and the second active material is capable of forming a memory point PM or a selector SE.

Figure 6:
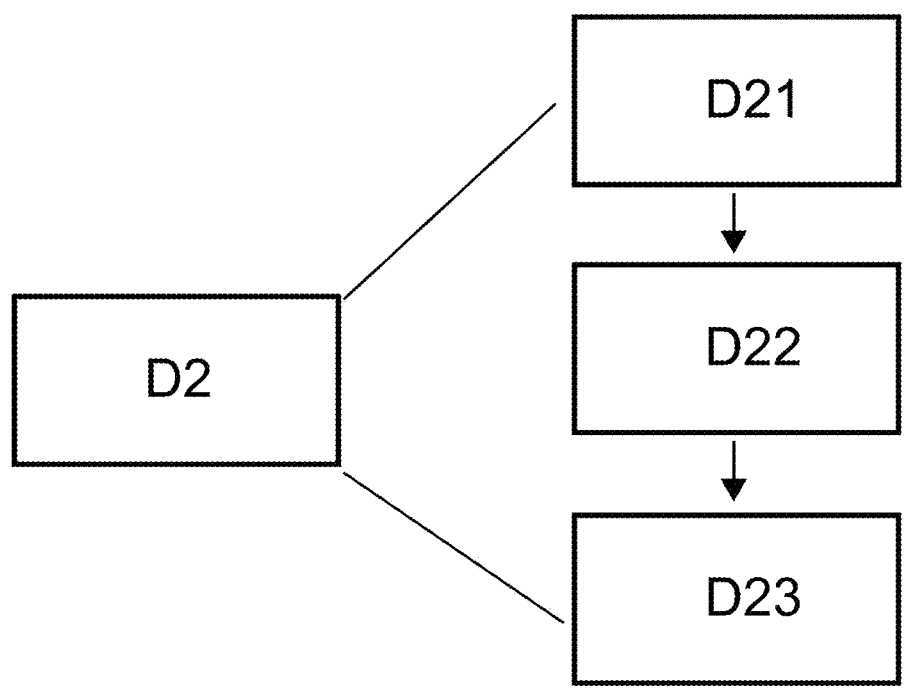
FIG. 6 shows a logic diagram of a step of the manufacturing method according to a second aspect of the invention.

In an embodiment illustrated in FIGS. 6 and 8B, the second step D2 of deposition of a first layer EP of a conductive material on the first layer CI of an insulating material comprises a step of deposition of a first sub-layer D21 made of a first conductive sub-layer material; a step of deposition of a second sub-layer D22 made of a second conductive sub-layer material; and a step of deposition of a third sub-layer D23 made of a third conductive sub-layer material. In addition, as illustrated in FIGS. 8F and 9A, the first material of the first sub-layer EP1 and the third material of the third sub-layer EP3 are etched at a rate different to that at which the material of the second sub-layer EP2 is etched during the first step SG1 of selective etching of the layer EP of a conductive material. Preferably, the conductive materials of the first sub-layer EP1 and the third sub-layer EP3 are identical.

In an embodiment illustrated in FIG. 8F, the first material of the first sub-layer EP1 and the third material of the third sub-layer EP3 are etched at a rate slower than the rate at which the second material of the second sub-layer EP2 is etched during the first step SG1 of selective etching of the plurality of first layers EP of a conductive material. Thus, as illustrated in FIG. 8K, at the end of the method according to the invention, the proximal end of the first sub-layer EP1 and the proximal end of the third sub-layer EP3 are closer to the vertical electrode EV than the proximal end of the second sub-layer EP2 so as to form an indentation RET, a part of the floating electrode being inserted into said indentation RET. More particularly, in the example of FIG. 8K, the floating electrode EF takes the form of a lying down T such that the part of the floating electrode EF corresponding to the foot of the T shape is inserted into the indentation RET.

In an alternative embodiment illustrated in FIG. 9A, the first material of the first sub-layer EP1 and the third material of the third sub-layer EP3 are etched at a rate faster than the rate at which the second material of the second sub-layer EP2 is etched during the first step SG1 of selective etching of the plurality of first layers EP of a conductive material. Thus, as illustrated in FIG. 9E, at the end of the method according to the invention, the proximal end of the first sub-layer EP1 and the proximal end of the third sub-layer EP3 are further away from the vertical electrode EV than the proximal end of the second sub-layer EP2 so as to form a protuberance PRT, the first active material then adopting the shape of a lying down H. Preferentially, the thickness of the floating electrode EF is greater than the thickness of the second sub-layer EP2 of the flat electrode EP. Thus, as illustrated in FIG. 9F, at the end of the method a flat electrode EP is obtained of which the end is made slimmer which makes it possible to favour the heating of said end, and thus has an advantage when the memory point PM is a phase change memory point.

In an exemplary embodiment, the method PRO comprises a first step D1 of deposition of a first layer CI of $SiO_x$, said layer having a thickness of 20 nm. This step is followed by a second step D2 of deposition of a first layer EP of TiN, said layer having a thickness of 20 nm and being deposited on the first layer CI of $SiO_x$. These two first steps are repeated so as to obtain a plurality of flat electrodes EP made of TiN, each flat electrode EP being separated from the preceding and from the following by a layer CI of $SiO_x$. In this exemplary embodiment, the method PRO also comprises a third step D3 of deposition of a second layer CI of $SiO_x$, said layer also having a thickness of 20 nm. The method next comprises a first step AG1 of anisotropic etching in the plurality of first layers CI of $SiO_x$, in the second layer CI of $SiO_x$ and in the plurality of first layers EP of TiN. The opening(s) (according to whether the device comprises one or more vertical electrodes EV) are of cylindrical shape and have a width of 100 nm (the height of the vertical electrode(s) EV being fixed by the number of flat electrodes EP). This step is followed by a first step SG1 of selective etching of the plurality of first layers EP of TiN so as to obtain a cavity CAV having a depth of 20 nm. The method next comprises a fourth step D4 of conformal deposition of a layer C1 of $HfO_2$, said layer having a thickness of 5 nm and constituting the first layer of an active material C1. This step is followed by a fifth step D5 of deposition of a layer EF' of Ti/TiN (5 nm/10 nm). The method PRO next comprises a second step AG2 of anisotropic etching of the layer EF of Ti/TiN and of the layer C1 of $HfO_2$. The method also comprises a sixth step D6 of conformal deposition of a second layer C2 of GeSe, said layer having a thickness of 50 nm. Finally, the method comprises a seventh step D7 of deposition of a third layer EV of TiN so as to fill the opening(s). Thus, at each flat electrode EP/vertical electrode EV intersection, the structure TiN/HfO2/Ti/TiN/GeSe/TiN is obtained, said structure corresponding to a ReRAM (thus in this example the memory is a resistive random access memory), a floating electrode of TiN as well as a selector. By reversing the order of deposition of the two active materials, it is obviously possible to obtain the reverse structure.

Figure 10:
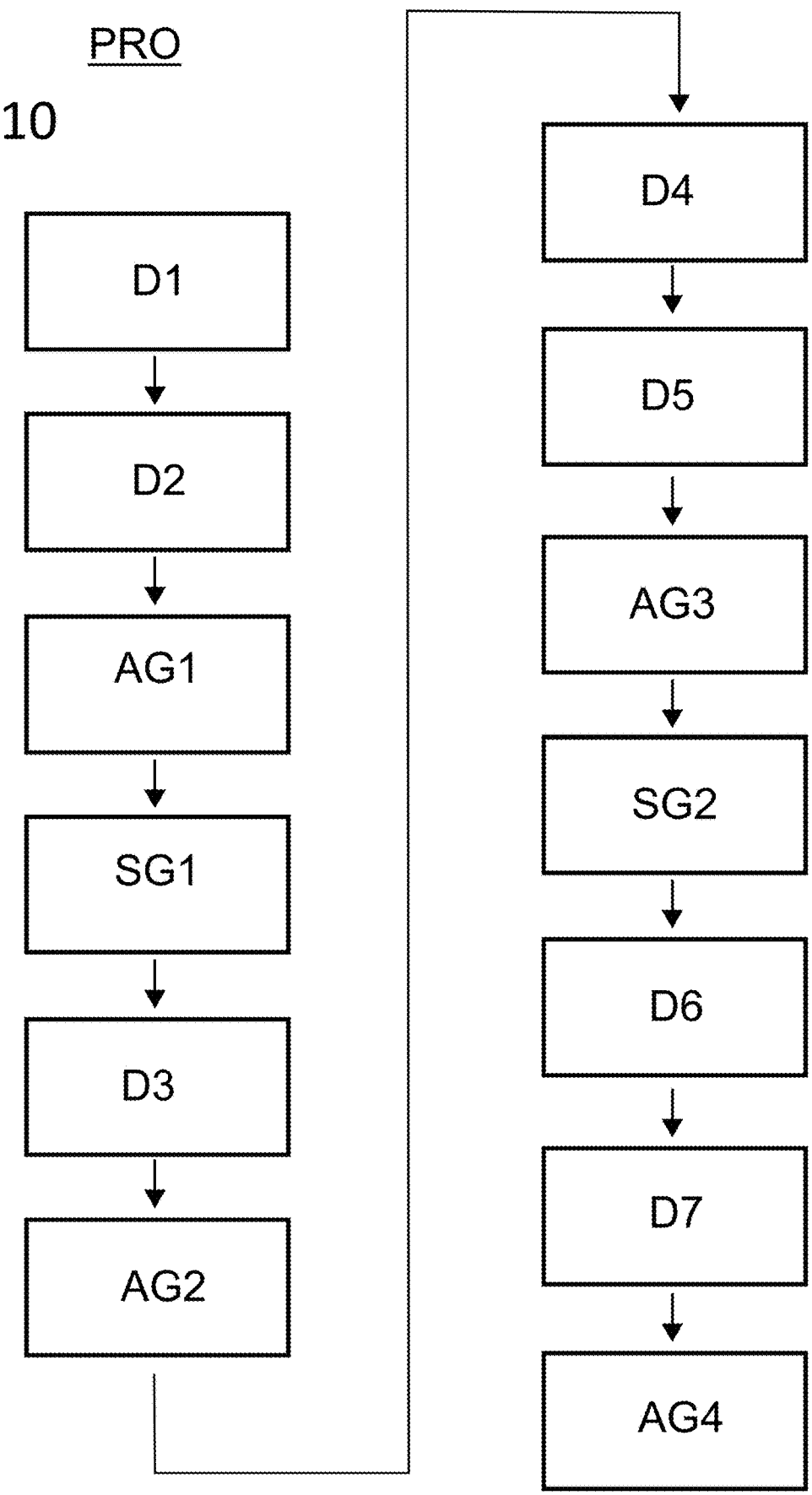
FIG. 10 shows a logic diagram of a manufacturing method according to a third aspect of the invention.
Figures 11A, 11B:
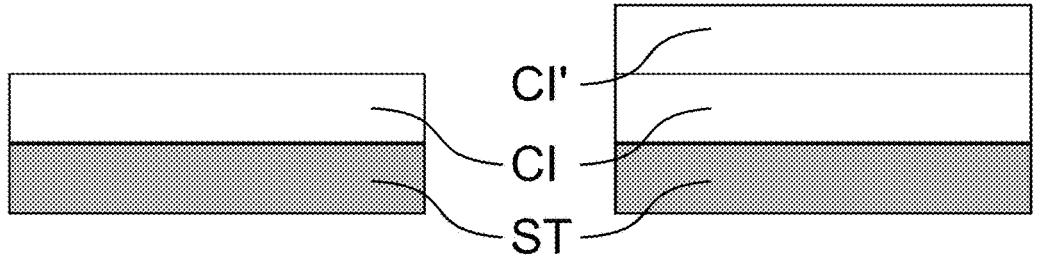
FIG. 11 shows a schematic representation of the different steps of a first embodiment of a method according to a third aspect of the invention.
Figures 11C, 11D:
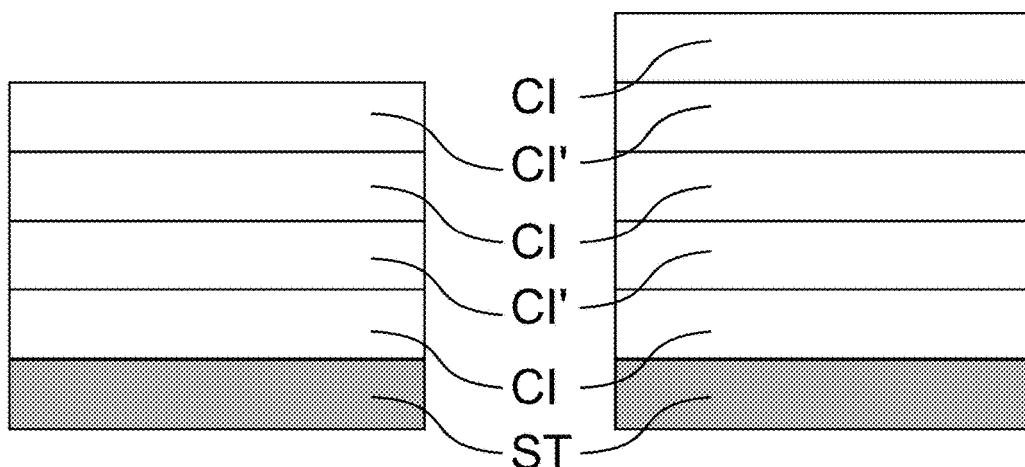

In order to obtain such a memory CO, a third aspect of the invention illustrated in FIGS. 10 and 11 relates to a method PRO for manufacturing a 3D memory. As illustrated in FIGS. 11A to 11C, the method PRO for manufacturing a 3D memory according to a third aspect of the invention comprises:

a first step D1 of deposition of a first layer CI of a first insulating material;

a second step D2 of deposition of a second layer CI' of a second insulating material on the first layer CI of a first insulating material;

the first step of deposition D1 of a first layer CI of a first insulating material and the second step D2 of deposition of a second layer CI' of a second insulating material being repeated, for example a number N of times to obtain N memory points PM per vertical electrode EV, so as to obtain a plurality of first layers CI of a first insulating material and a plurality of second layers CI' of a second insulating material. The deposition may for example be carried out on a semiconductor substrate ST, for example a silicon substrate. The first and second insulating materials may notably be chosen from SiN and $SiO_x$. Obviously, the first insulating material is different from the second insulating material in order to be able to carry out a selective etching as will be seen hereafter. As illustrated in FIG. 11D, the method PRO according to the invention may advantageously comprise an additional step of deposition of a third layer CI of a third insulating material on the final second layer CI' of a second insulating material of the plurality of second layers CI' of a second insulating material. The insulating material may notably be chosen from SiN and $SiO_x$ and may be identical to the first insulating material.

Figure 11E:
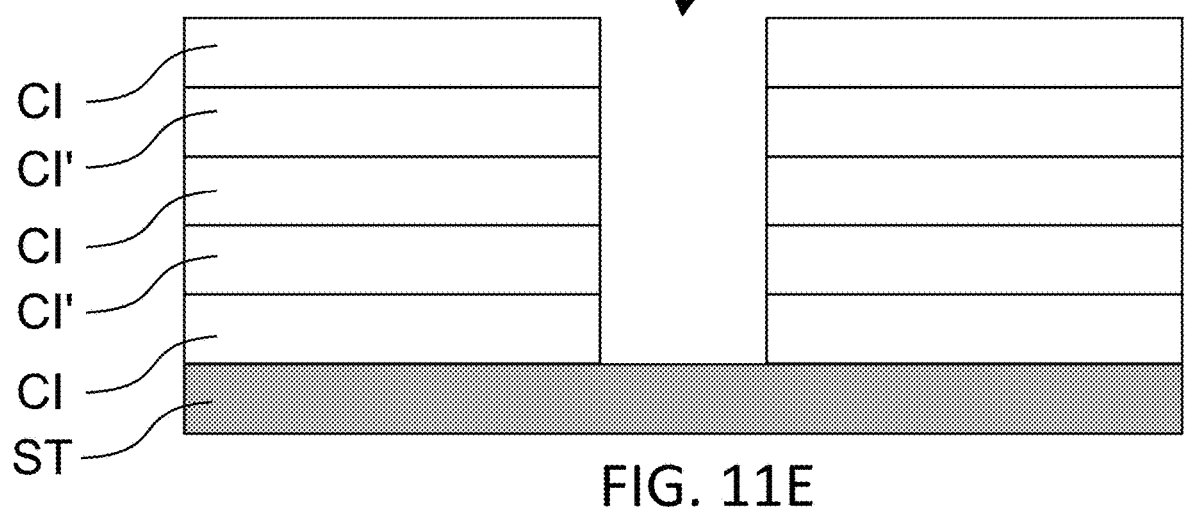

As illustrated in FIG. 11E, the method also comprises a first step AG1 of anisotropic etching in the plurality of first layers CI of a first insulating material, in the third layer CI of a third insulating material (if the latter exists) and in the plurality of second layers CI' of a second insulating material so as to create a first opening OUV. If necessary, this etching may be carried out in several sub-steps, as a function of the materials used for the layers of insulating materials CI, CI'.

Figure 11F:
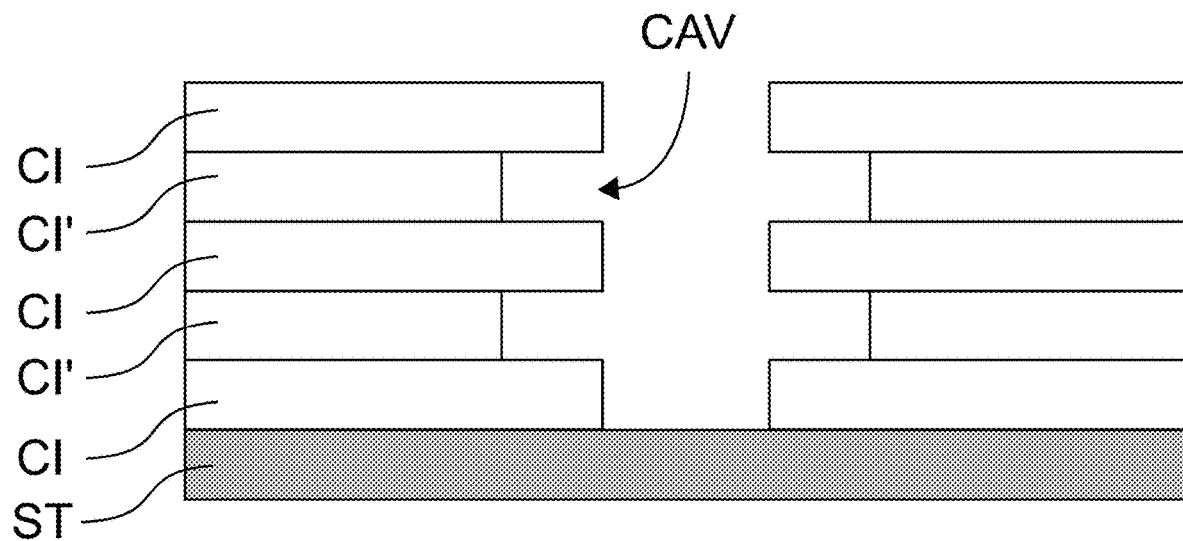

As illustrated in FIG. 11F, this step is followed by a first step SG1 of selective etching of the plurality of second layers CI' of a second insulating material. The etching being selective, the plurality of first layers CI of a first insulating material is etched less quickly than the plurality of second layers CI' of a second insulating material such that a cavity CAV is formed at the level of each second layer CI' of a second insulating material.

Figure 11G:
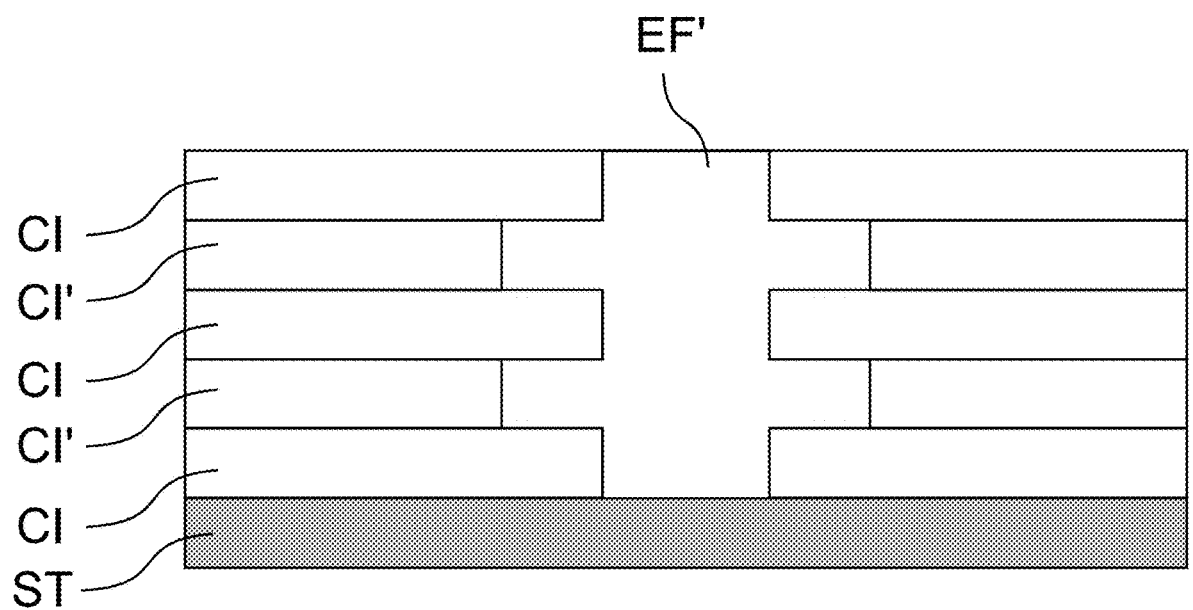

As illustrated in FIG. 11G, this step is followed by a third step D3 of deposition of a first layer EF' of a conductive material. The conductive material may be chosen from TiN, TaN, TaCN, Ta, Ti, W, Cu, Al and/or Ag. The material thus deposited fills the cavities CAV obtained during the first step SG1 of selective etching. In FIG. 11G, the first layer EF' of a conductive material is represented as filling the totality of the opening, but this is not an obligation, the first layer EF' of a conductive material having on the other hand to fill the totality of each cavity CAV.

Figure 11H:
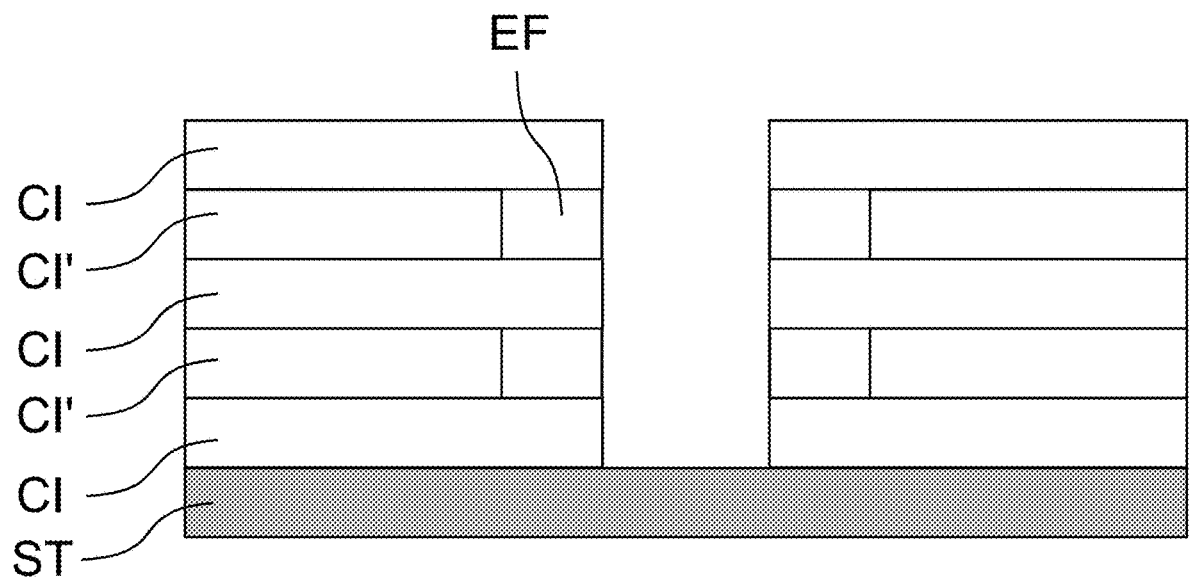

As illustrated in FIG. 11H, this step is followed by a second step AG2 of anisotropic etching of the first layer EF' of a conductive material. The anisotropic etching makes it possible to conserve the part of the first layer EF' of a conductive material present in each cavity CAV so as to form, for each future flat electrode EP, a floating electrode EF.

Figure 11I:
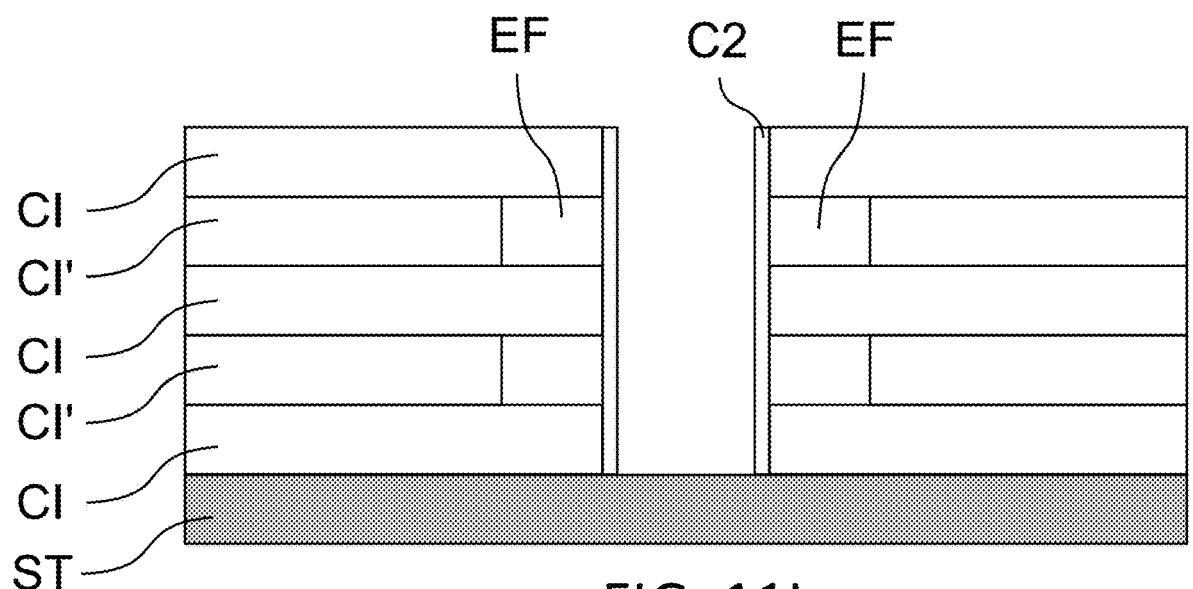

As illustrated in FIG. 11I, the method next comprises a fourth step D4 of conformal deposition of a second layer C2 of a second active material. When the second active material is intended to play the role of selector, the latter may notably be chosen from VON, GeSe, $TiO_x$ and/or $Ta_xO_y$. When this second active material is intended to play the role of memory point, the latter may notably be chosen from $HfO_x$, $AlxO_y$, $TaxO_y$, CuTeGe, GST, $TiO_x$ and/or $SiO_x$. When the conductive material deposited during the third step D3 of deposition of a first layer EF' of a conductive material is a transition metal, then the second active material of the second layer C2 may be deposited by annealing (by thermal treatment or by plasma) under a controlled atmosphere.

Figure 11J:
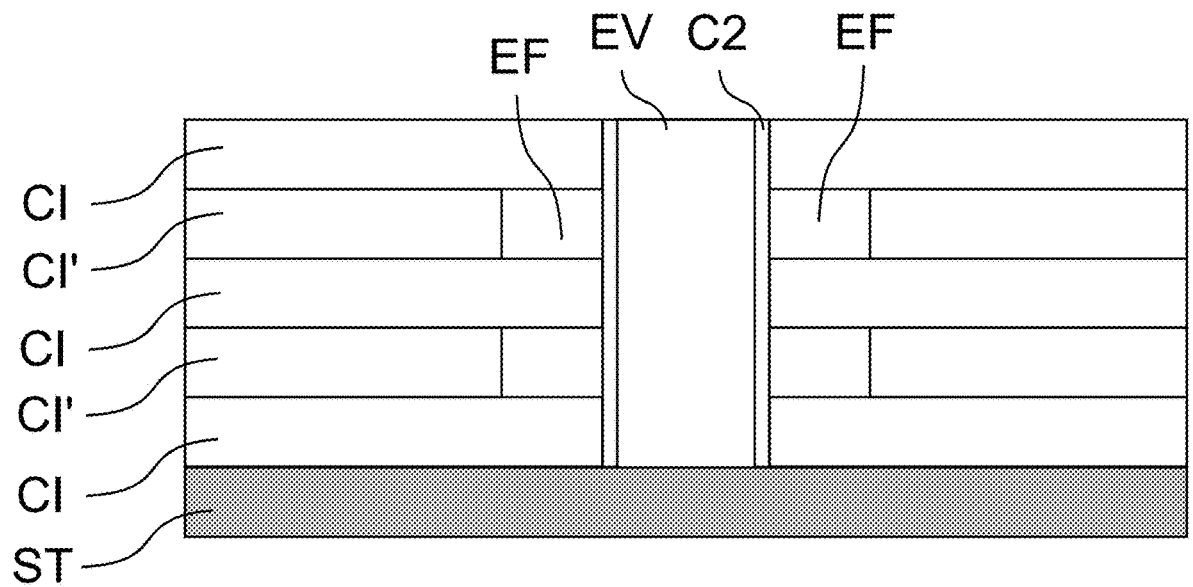

As illustrated in FIG. 11J, the method next comprises a fifth step D5 of deposition of a second layer EV of a conductive material. The material deposited may notably be chosen from TiN, TaN, TaCN, Ta, Ti, W, Cu, Al and Ag. The material thus deposited makes it possible to form the vertical electrode EV of the 3D memory.

Figure 11K:
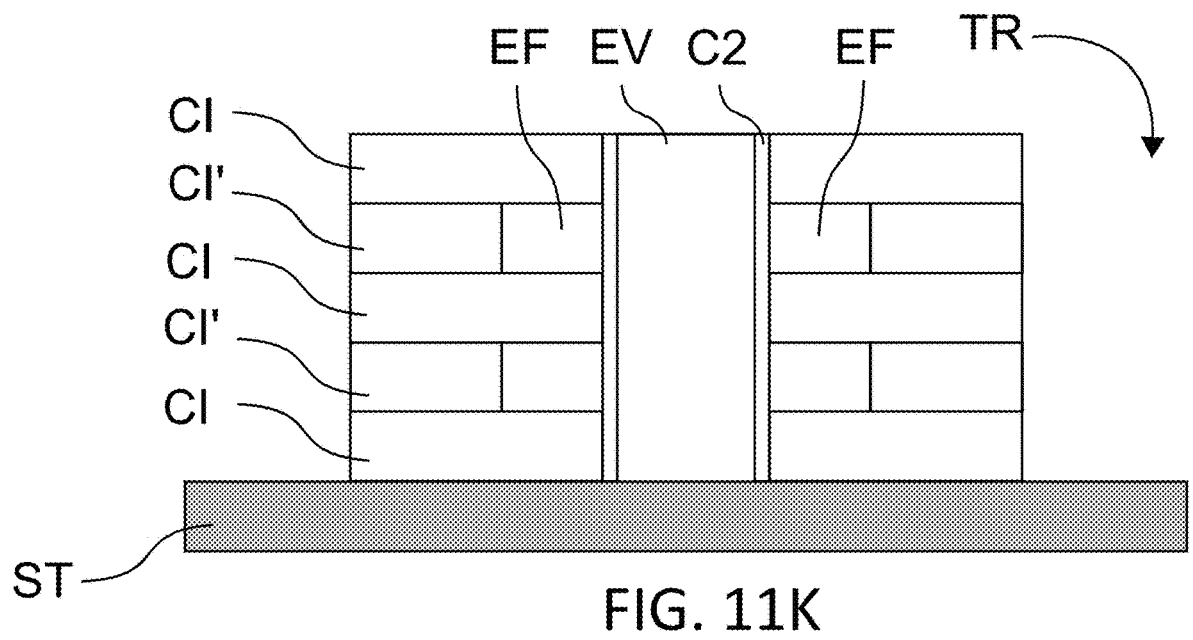
Figure 14A:
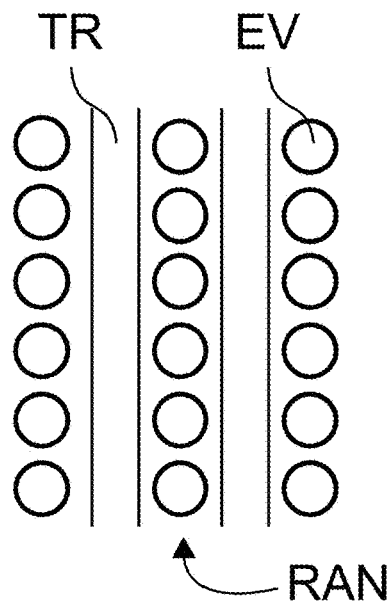
FIG. 14 illustrates two possible configurations for the vertical electrodes in the case of a device comprising a plurality of vertical electrodes.
Figure 14B:
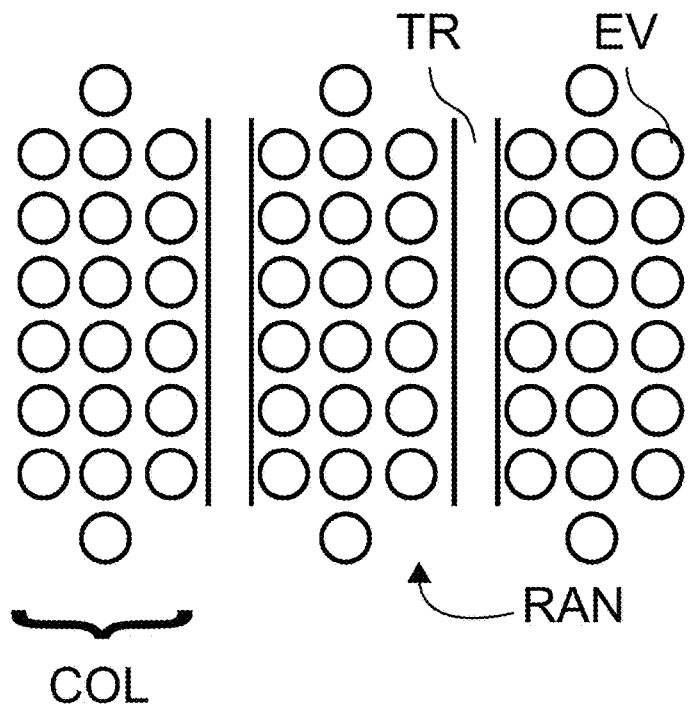

As illustrated in FIG. 11K, the method also comprises a third step AG3 of anisotropic etching in the plurality of first layers CI of a first insulating material and in the plurality of second layers CI' of a second insulating material, so as to obtain a second opening taking the form of a trench. If necessary, this etching may be carried out in several sub-steps, as a function of the materials used for the layers of insulating materials. When several vertical electrodes EV are present, the latter are in general organised into one or more rows RAN. In this case, in a first embodiment illustrated in FIG. 14A, each trench TR produced during the third step AG3 of anisotropic etching in the plurality of first layers CI of a first insulating material and in the plurality of second layers CI' of a second insulating material is arranged so as to separate two consecutive rows RAN. In an embodiment illustrated in FIG. 14B, the rows RAN form columns COL, each column COL comprising several rows RAN, and each trench TR produced during the third step AG3 of anisotropic etching in the plurality of first layers CI of a first insulating material and in the plurality of second layers CI' of a second insulating material is arranged so as to separate two consecutive columns COL.

Figure 11L:
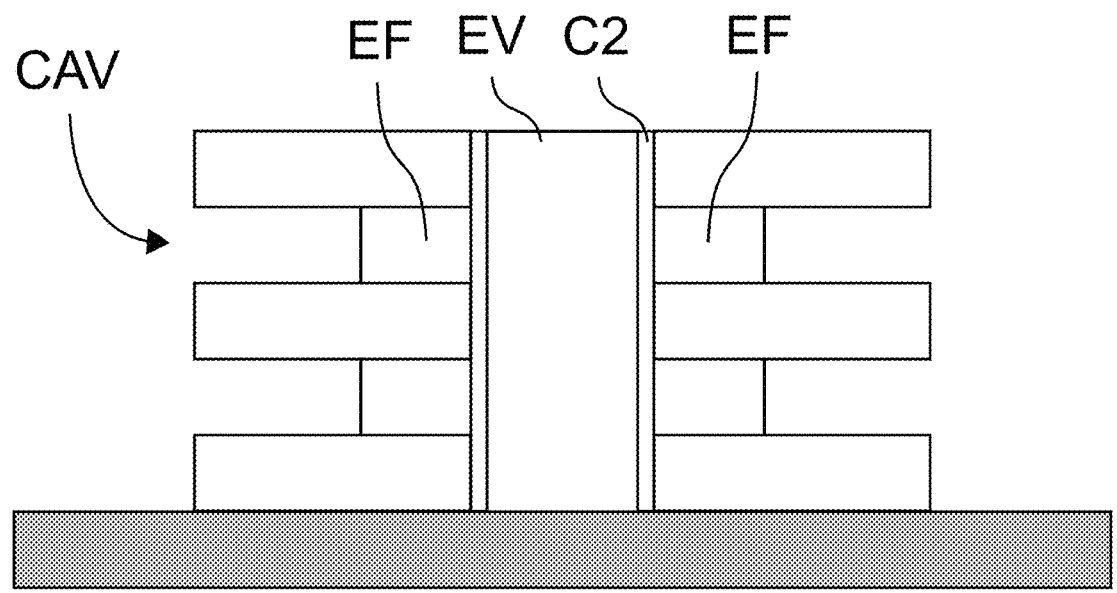

As illustrated in FIG. 11L, the method next comprises a second step SG2 of selective etching of the plurality of second layers CI' of a second insulating material. As has been detailed for the first step of selective etching SG1, the plurality of first layers CI of a first insulating material is etched less quickly than the plurality of second layers CI' of a second insulating material such that a cavity CAV is formed at the level of each second layer CI' of a second insulating material. As illustrated in FIG. 4L, this etching step is carried out until each floating electrode EF is cleared, that is to say that a surface of each floating electrode EF can be exposed to a deposition of material.

Figure 11M:
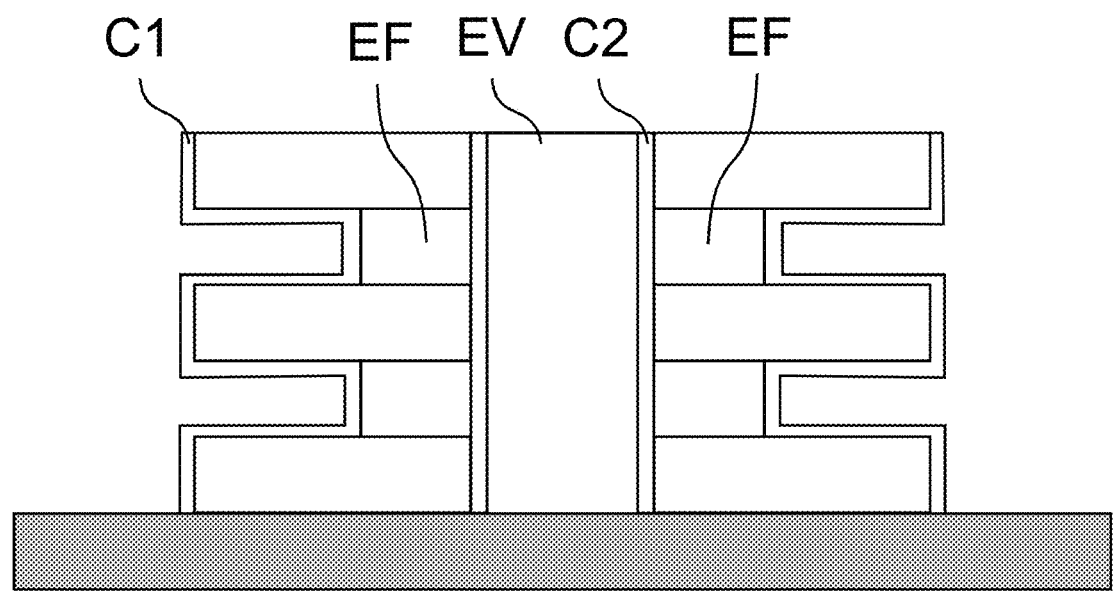

As illustrated in FIG. 11M, the method next comprises a sixth step D6 of conformal deposition of a first layer C1 of a first active material. When the first active material is intended to play the role of selector SE, the latter may notably be chosen from $VO_x$, GeSe, $TiO_x$ and/or $Ta_xO_y$. When this first active material is intended to play the role of memory point PM, the latter may notably be chosen from $HfO_x$, $AlxO_y$, $TaxO_y$, CuTeGe, GST, $TiO_x$ and/or $SiO_x$. It appears obvious from the preceding that when the first layer C1 of a first active material is intended to play the role of selector SE (respectively, memory point PM) then the second layer C2 of a second active material is intended to play the role of memory point PM (respectively, selector SE).

Figure 11N:
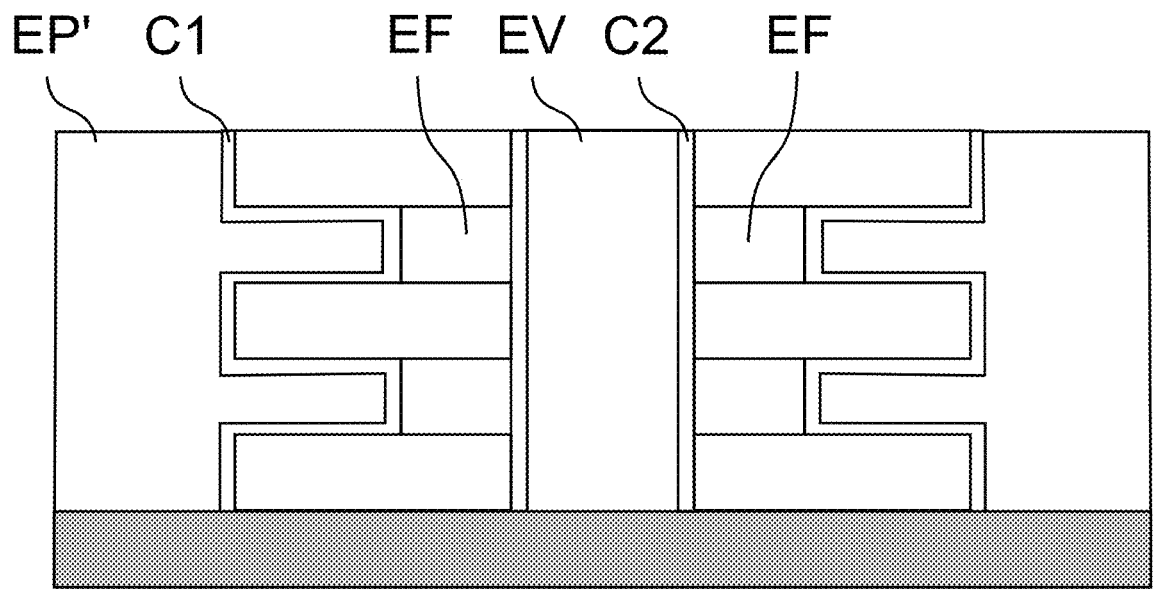

As illustrated in FIG. 11N, the method next comprises a seventh step D7 of deposition of a third layer EP' of a conductive material. The conductive material may be chosen from TiN, TaN, TaCN, Ta, Ti, W, Cu, Al and/or Ag. The material is deposited so as to fill the cavities CAV obtained during the second step SG2 of selective etching.

Figure 11O:
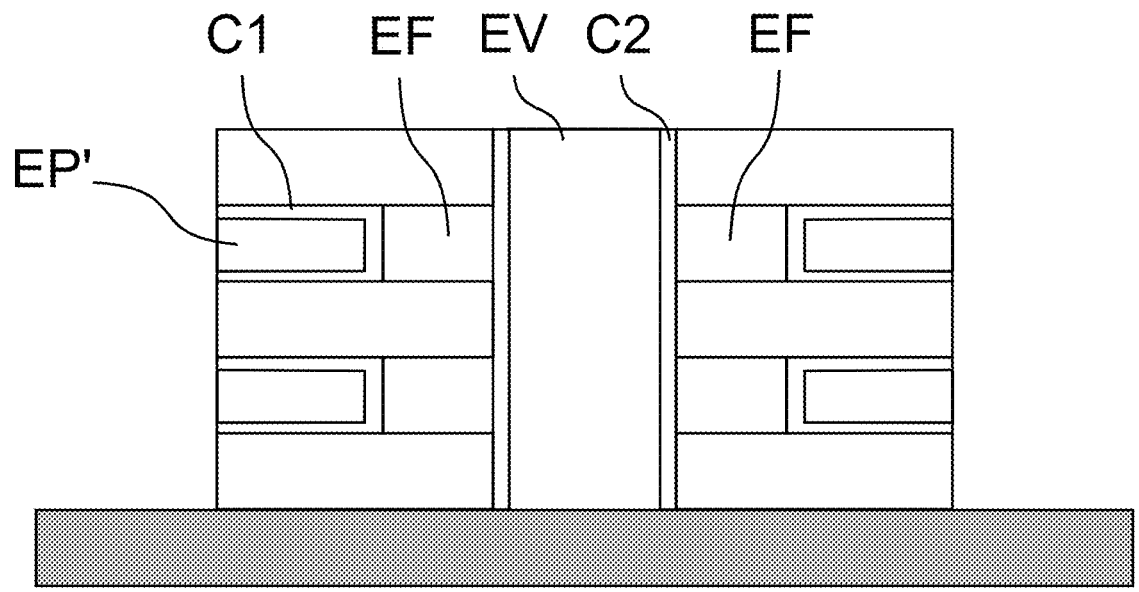

Finally, as illustrated in FIG. 11O, the method comprises a fourth step AG4 of anisotropic etching of the third layer EP' of a conductive material and the first layer C1 of a first active material. The contact pick up at the level of each flat electrode EP of the plurality of flat electrodes EP thus obtained may next be carried out, at the level of the trenches TR, by known methods.

The 3D memory CO thus obtained comprises a plurality of first electrodes EP, referred to as flat electrodes EP, each flat electrode EP of the plurality of flat electrodes EP defining a plane P; a second electrode EV, referred to as vertical electrode EV, extending essentially along an axis Z perpendicular to the plane PM defined by each flat electrode EP; a plurality of first layers CI of an insulating material, each flat electrode EP of the plurality of flat electrodes EP being separated from the preceding and/or following flat electrode EP by a first layer CI of an insulating material of the plurality of first layers CI of an insulating material. The 3D memory also comprises a plurality of third electrodes EF, referred to as floating electrodes, each floating electrode EF being situated between the flat electrode EP with which it is associated and the vertical electrode EV; a plurality of first layers C1 of a first active material separating each flat electrode EP from the floating electrode EF that is associated therewith; a second layer of a second active material separating the vertical electrode EV from each floating electrode EF of the plurality of floating electrodes EF. Moreover, the first active material is capable of forming a selector SE or a memory point PM and the second active material is capable of forming a memory point PM or a selector SE.

Figure 12:
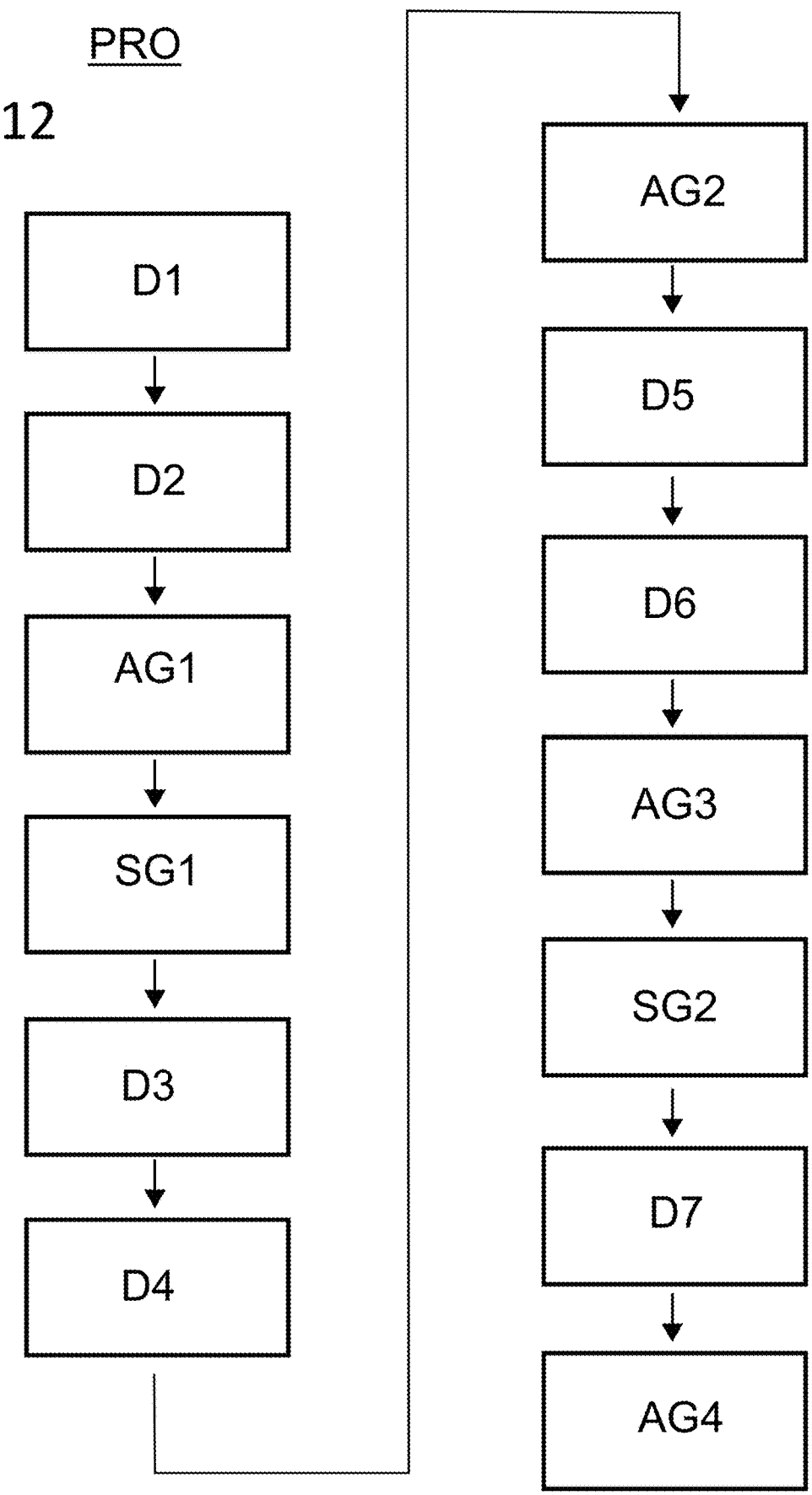
FIG. 12 shows a logic diagram of a manufacturing method according to a fourth aspect of the invention.

A fourth aspect illustrated in FIGS. 12 and 13 relates to an alternative method PRO for manufacturing a 3D memory. As illustrated in FIGS. 13A to 13C, the method for manufacturing a 3D memory according to a second aspect of the invention comprises:

a first step D1 of deposition of a first layer CI of a first insulating material;

a second step D2 of deposition of a second layer CI' of a second insulating material on the first layer CI of a first insulating material.

The deposition may for example be carried out on a semiconductor substrate ST, for example a silicon substrate.

Figures 13A, 13B:
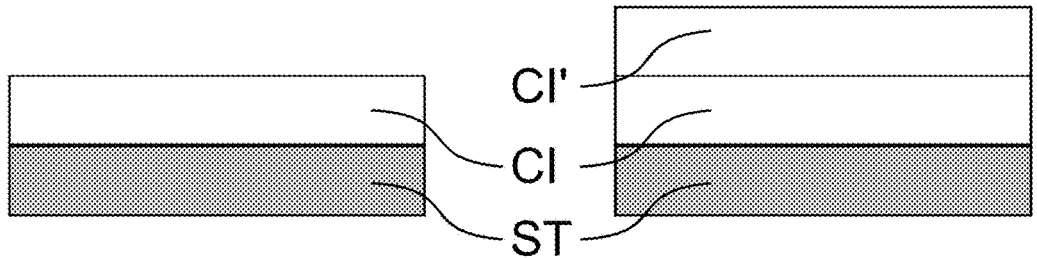
FIG. 13 shows a schematic representation of the different steps of a second embodiment of a method according to a fourth aspect of the invention.
Figures 13C, 13D:
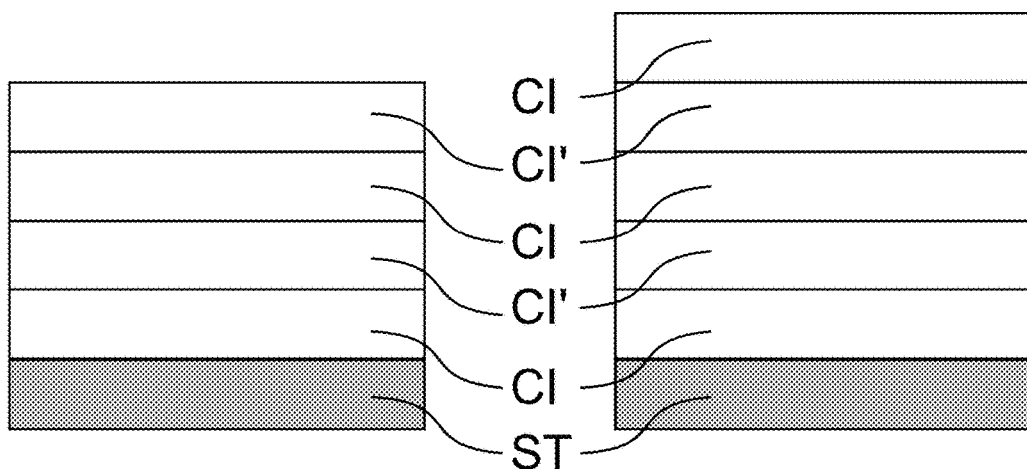

The first and second insulating materials may notably be chosen from SiN and $SiO_x$. The first insulating material is different from the second insulating material so as to be able to be etched in a selective manner as will be seen hereafter. The first step D1 of deposition of a first layer CI of a first insulating material and the second step D2 of deposition of a second layer EP of a second insulating material are repeated, for example a number N of times to obtain N memory points PM per vertical electrode EV, so as to obtain a plurality of first layers CI of a first insulating material and a plurality of second layers CI' of a second conductive material. As illustrated in FIG. 13D, the method PRO according to the invention may advantageously comprise an additional step of deposition of a third layer CI of a third insulating material on the final second layer CI' of a second insulating material of the plurality of second layers CI' of a second insulating material. The insulating material may notably be chosen from SiN and $SiO_x$. It may be identical to the first insulating material.

Figure 13E:
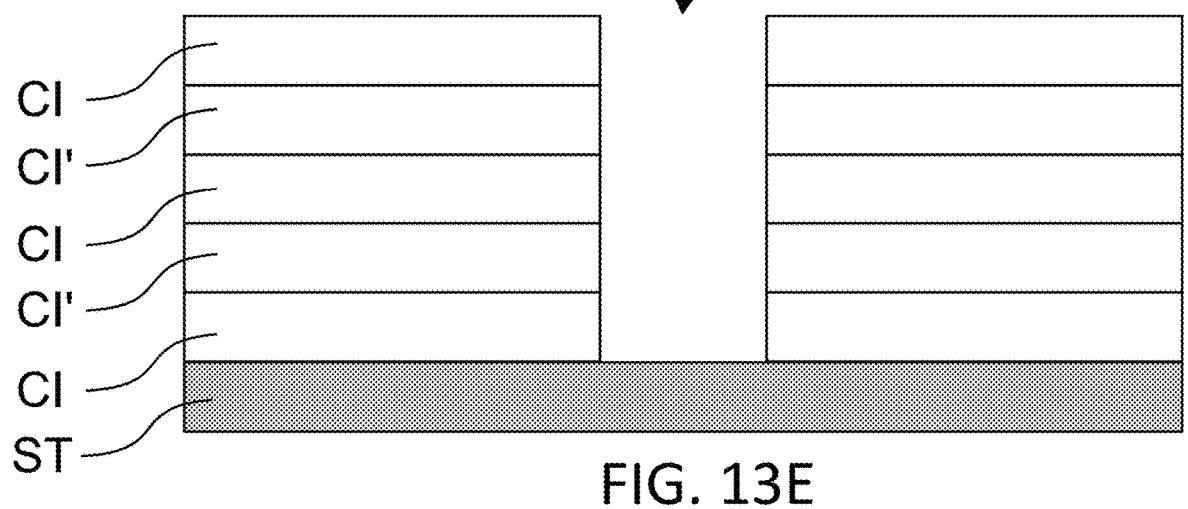

As illustrated in FIG. 13E, the method also comprises a first step AG1 of anisotropic etching in the plurality of first layers CI of a first insulating material, in the third layer CI of a third insulating material (if the latter exists) and in the plurality of second layers CI' of a second insulating material so as to create a first opening OUV. If necessary, this etching may be carried out in several sub-steps, as a function of the materials used for the layers of insulating materials.

Figure 13F:
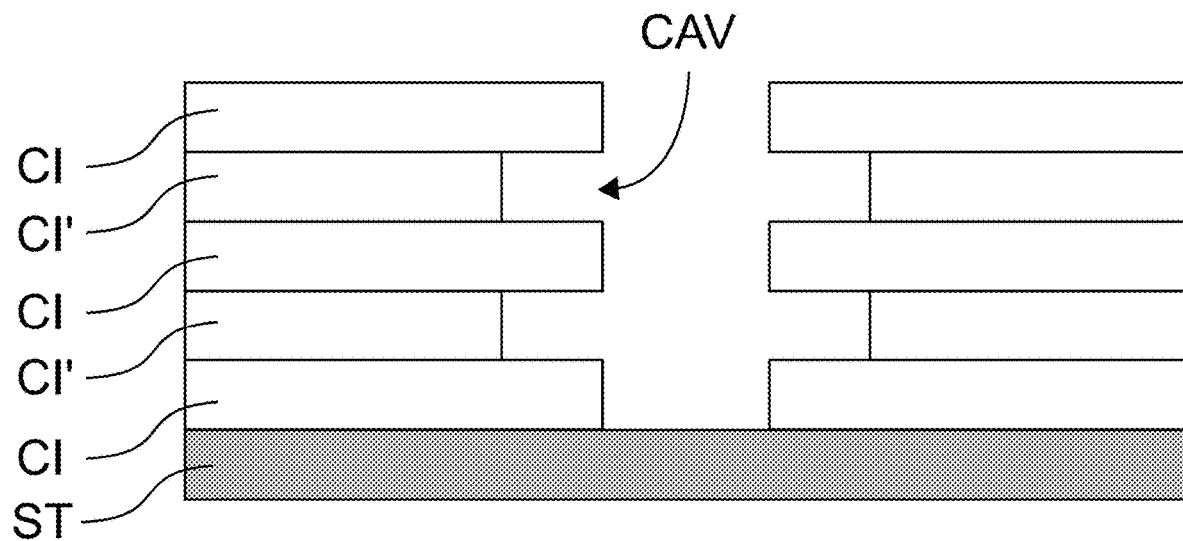

As illustrated in FIG. 13F, the method also comprises a first step SG1 of selective etching of the plurality of second layers CI' of a second insulating material. The etching being selective, the plurality of first layers CI of a first insulating material is etched less quickly than the plurality of second layers CI' of a second insulating material such that a cavity CAV is formed at the level of each second layer CI' of a second insulating material.

Figure 13G:
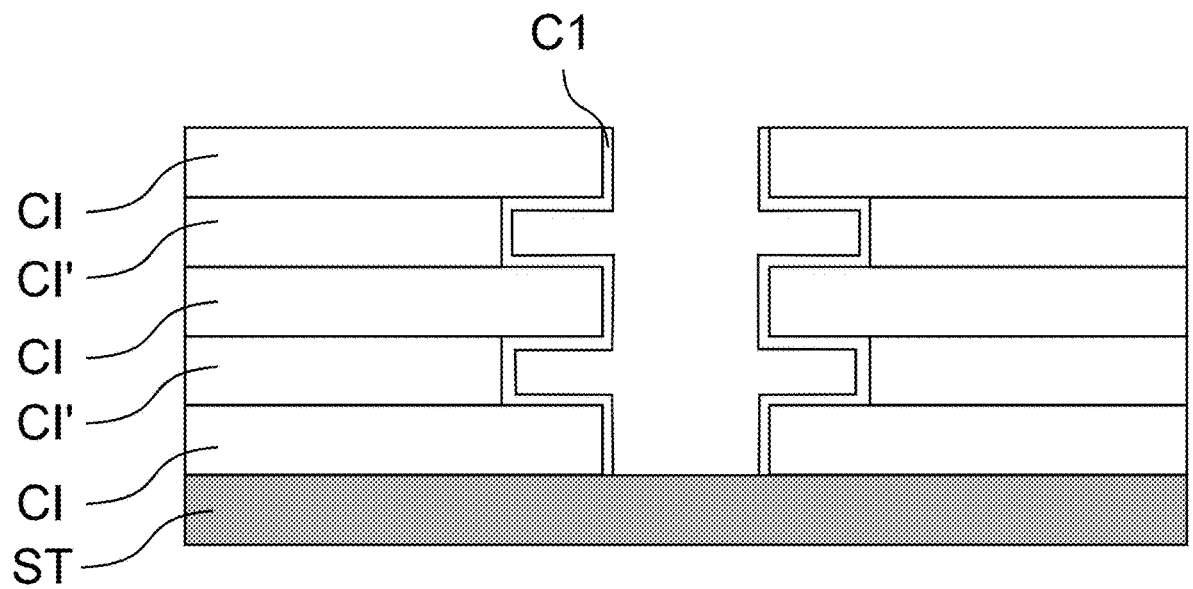

As illustrated in FIG. 13G, the method also comprises a third step D3 of conformal deposition of a first layer C1 of a first active material. When the first active material is intended to play the role of selector SE, the latter may notably be chosen from $VO_x$, GeSe, $TiO_x$ and/or $Ta_xO_y$. When this first active material is intended to play the role of memory point PM, the latter may notably be chosen from $HfO_x$, $AlxO_y$, $TaxO_y$, CuTeGe, GST, $TiO_x$ and/or $SiO_x$.

Figure 13H:
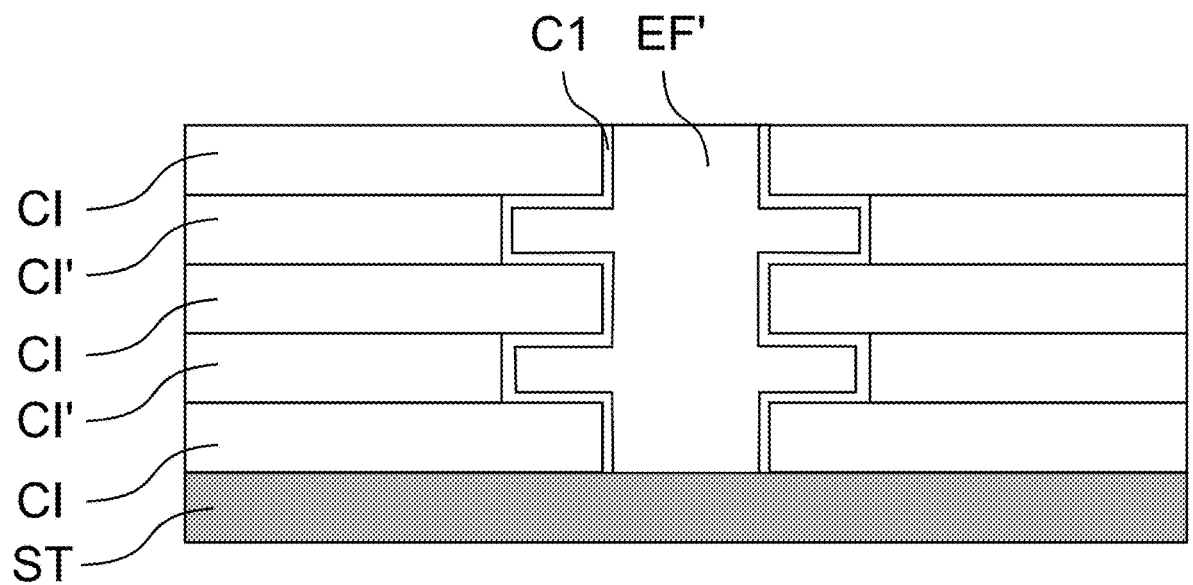

As illustrated in FIG. 13H, the method next comprises a fourth step D4 of deposition of a first layer EF' of a conductive material. The conductive material may be chosen from TiN, TaN, TaCN, Ta, Ti, W, Cu, Al and/or Ag. The material thus deposited fills the cavities CAV obtained during the first step SG1 of selective etching. In FIG. 13H, the first layer EF' of a conductive material is represented as filling the totality of the opening, but this is not an obligation, the first layer EF' of a conductive material having on the other hand to fill the totality of each cavity CAV.

Figure 13I:
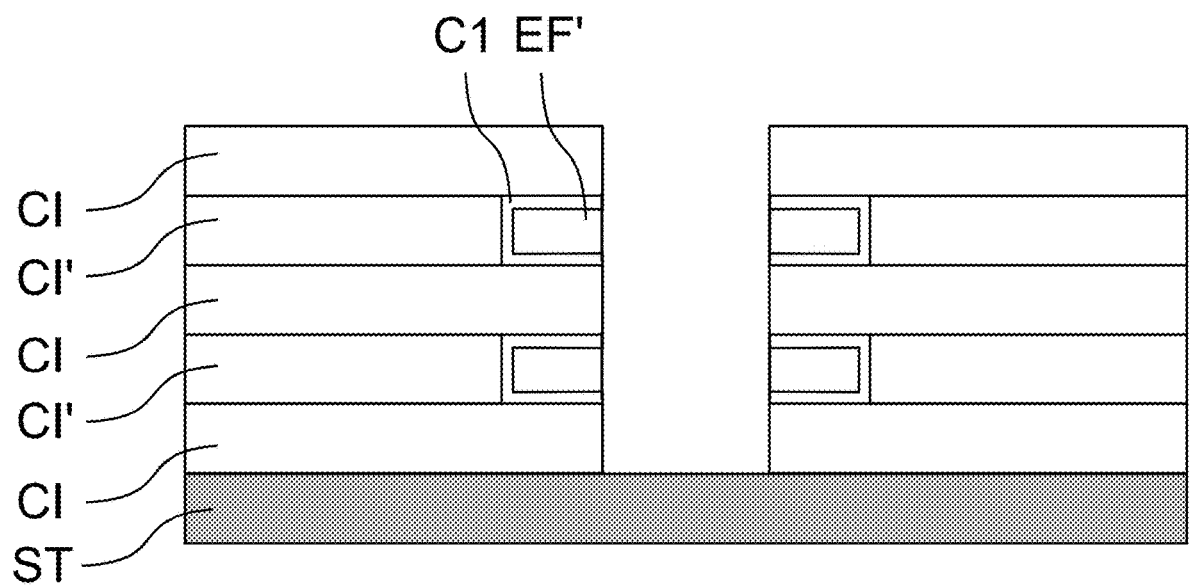

As illustrated in FIG. 13I, this step is followed by a second step AG2 of anisotropic etching of the first layer EF' of a conductive material and in the first layer C1 of a first active material. The anisotropic etching makes it possible to conserve the part of the second layer EF' of a conductive material and the first layer of an active material C1 present in the cavity CAV so as to form, for each future flat electrode EP, a floating electrode EF.

Figure 13J:
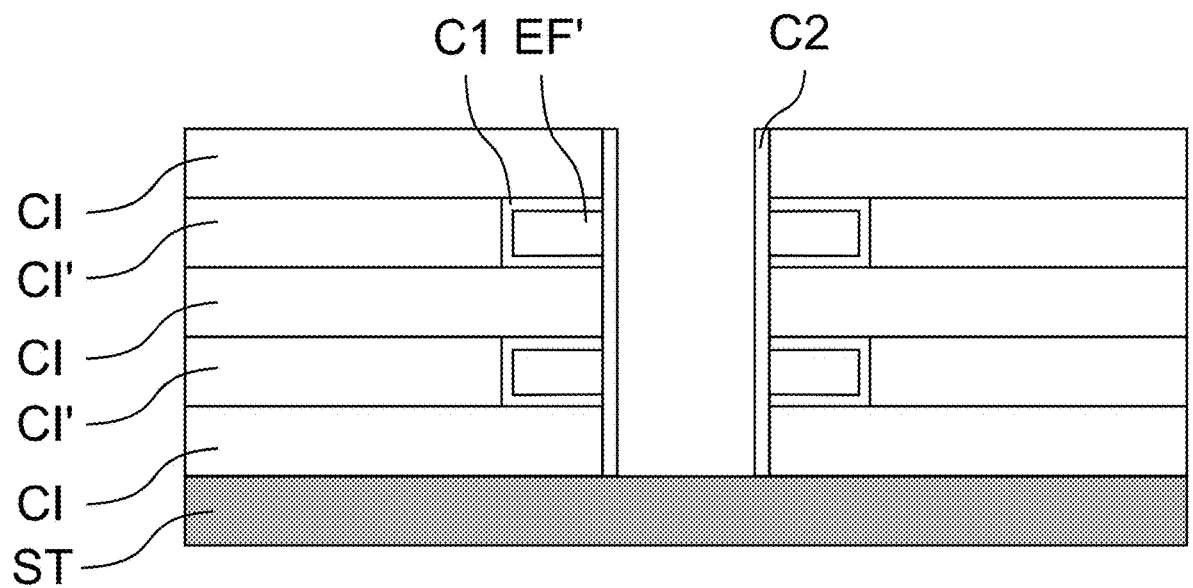

As illustrated in FIG. 13J, the method also comprises a fifth step D5 of conformal deposition of a second layer C2 of a second active material. When the second active material is intended to play the role of selector, the latter may notably be chosen from VON, GeSe, $TiO_x$ and/or $Ta_xO_y$. When this second active material is intended to play the role of memory point, the latter may notably be chosen from $HfO_x$, $AlxO_y$, $TaxO_y$, CuTeGe, GST, $TiO_x$ and/or $SiO_x$. When the conductive material deposited during the fifth step D5 of deposition of a first layer EF' of conductive material is a transition metal, then the second active material of the second layer C2 of an active material may be deposited by annealing (by thermal treatment or by plasma) under a controlled atmosphere. It appears obvious from the preceding that when the first layer C1 of a first active material is intended to play the role of selector SE (respectively, memory point PM) then the second layer C2 of a second active material is intended to play the role of memory point PM (respectively, selector SE).

Figure 13K:
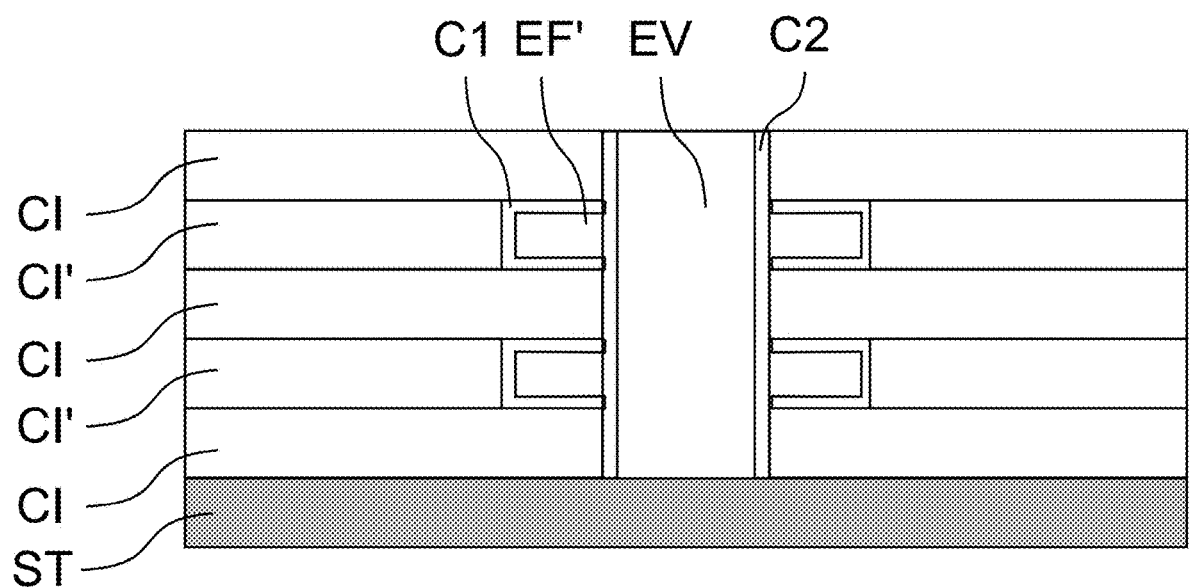

As illustrated in FIG. 13K, the method next comprises a sixth step D6 of deposition of a second layer EV of a conductive material. The material deposited may notably be chosen from TiN, TaN, TaCN, Ta, Ti, W, Cu, Al and Ag. The material thus deposited makes it possible to form the vertical electrode EV of the 3D memory.

Figure 13L:
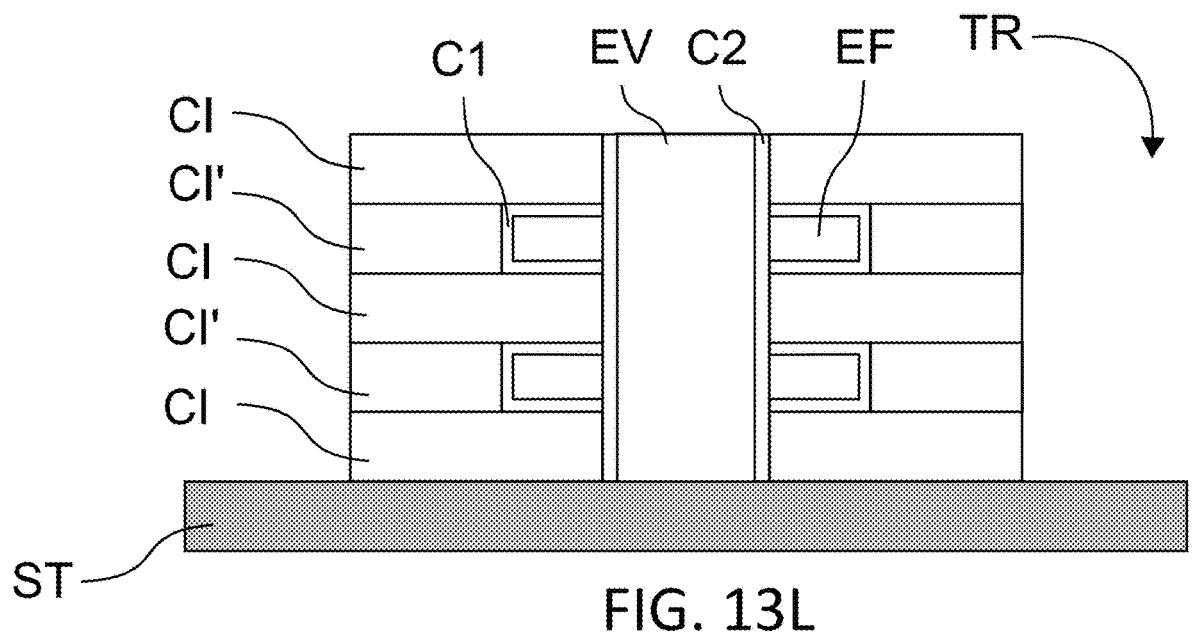

As illustrated in FIG. 13L, the method also comprises a third step AG3 of anisotropic etching in the plurality of first layers CI of a first insulating material and in the plurality of second layers CI' of a second insulating material, so as to obtain a second opening taking the form of a trench. If necessary, this etching may be carried out in several sub-steps, as a function of the materials used for the layers of insulating materials CI, CI'.

When several vertical electrodes EV are present, the latter are in general organised into one or more rows RAN. In this case, in a first embodiment illustrated in FIG. 14A, each trench TR produced during the third step AG3 of anisotropic etching in the plurality of first layers CI of a first insulating material and in the plurality of second layers CI' of a second insulating material is arranged so as to separate two consecutive rows RAN. In an embodiment illustrated in FIG. 14B, the rows RAN form columns COL, each column COL comprising several rows RAN, and each trench TR produced during the third step AG3 of anisotropic etching in the plurality of first layers CI of a first insulating material and in the plurality of second layers CI' of a second insulating material is arranged so as to separate two consecutive columns COL.

Figure 13M:
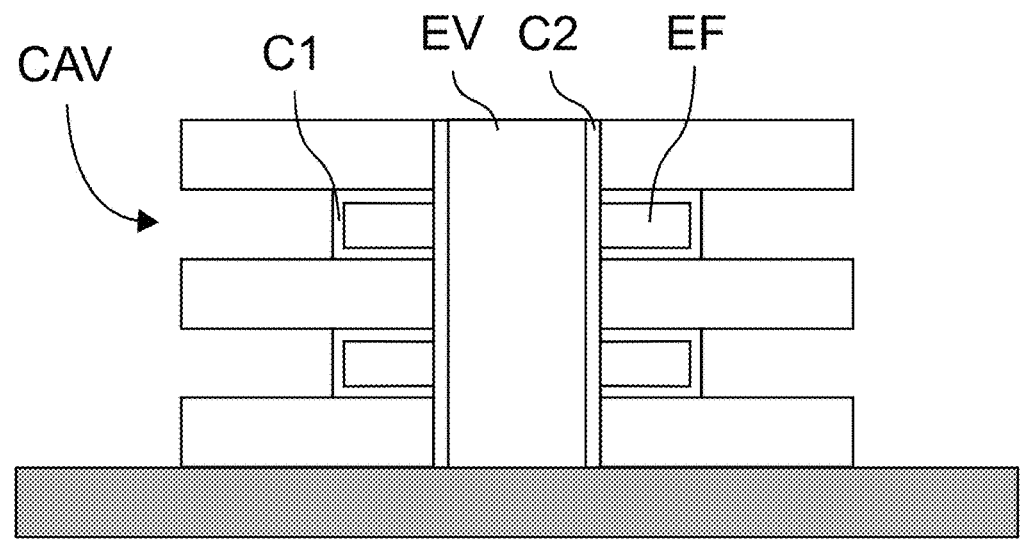

As illustrated in FIG. 13M, the method next comprises a second step SG2 of selective etching of the plurality of second layers CI' of a second insulating material. As has been detailed for the first step of selective etching SG1, the plurality of first layers CI of a first insulating material is etched less quickly than the plurality of second layers CI' of a second insulating material such that a cavity CAV is formed at the level of each second layer CI' of a second insulating material. As illustrated in FIG. 6M, this etching step is carried out until each first layer C1 of a first active material is cleared, that is to say that a surface of each first layer C1 of a first active material can be exposed to a deposition of material.

Figure 13N:
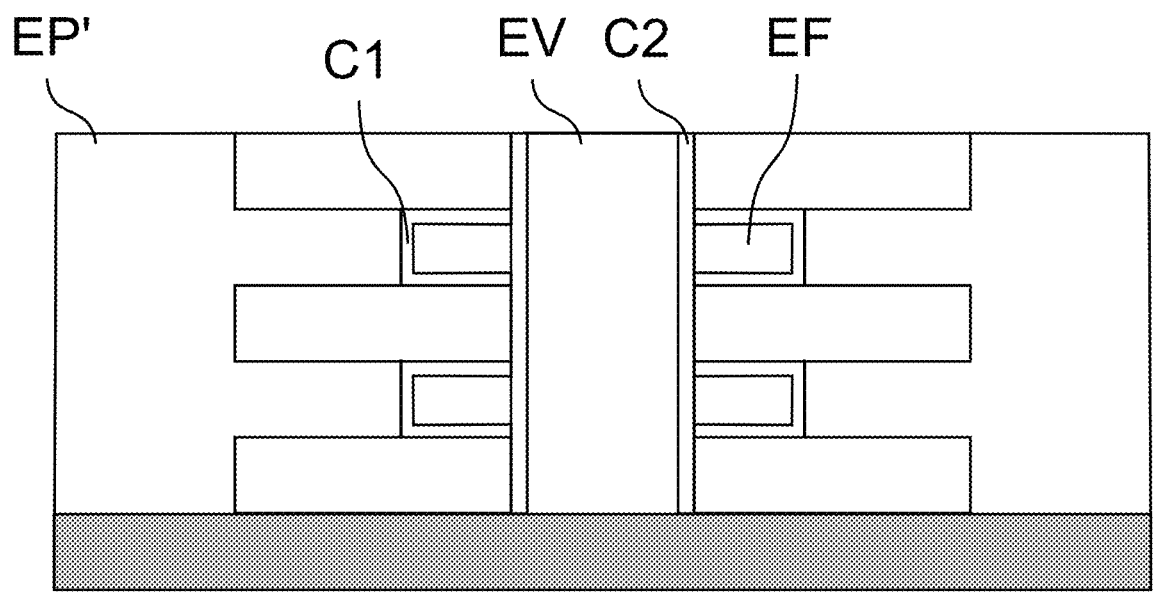
Figure 13O:
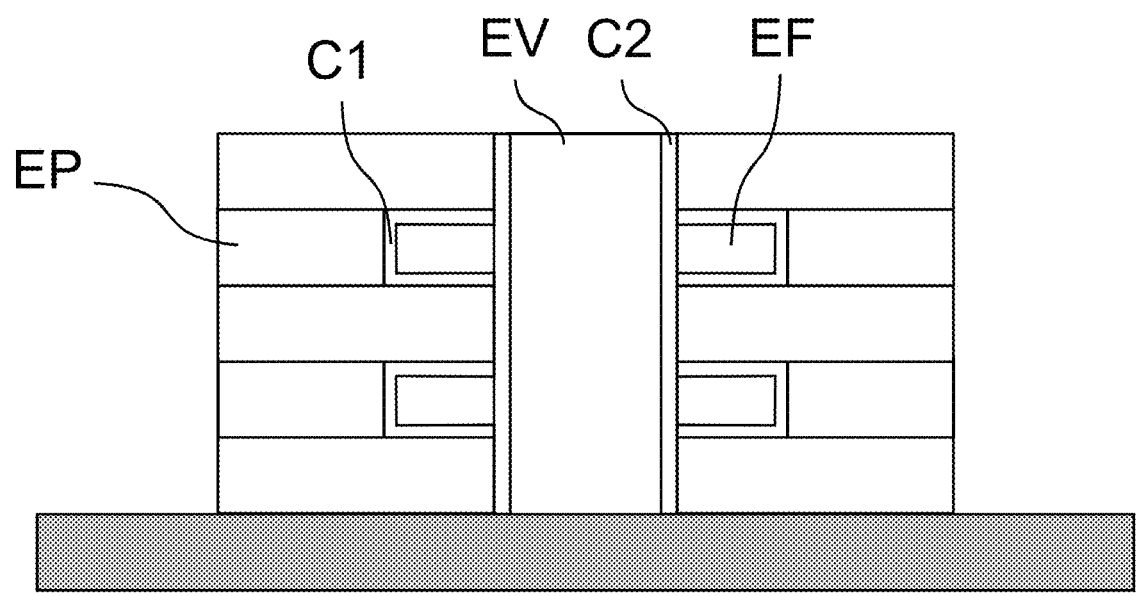

As illustrated in FIG. 13N, the method also comprises a seventh step D7 of deposition of a third layer EP' of a conductive material. The conductive material may be chosen from TiN, TaN, TaCN, Ta, Ti, W, Cu, Al and/or Ag. The material is deposited so as to fill the cavities CAV obtained during the second step SG2 of selective etching. Finally, as illustrated in FIG. 13O, the method comprises a fourth step AG4 of anisotropic etching of the fourth layer EP' of a conductive material. The contact pick up at the level of each flat electrode EP of the plurality of flat electrodes EP thus obtained may next be carried out, at the level of the trenches TR, by known methods.

The 3D memory CO obtained by means of a method according to a second aspect, a third aspect or a fourth aspect of the invention thus comprises a plurality of first electrodes EP, referred to as flat electrodes EP, each flat electrode EP of the plurality of flat electrodes EP defining a plane P; a second electrode EV, referred to as vertical electrode EV, extending essentially along an axis Z perpendicular to the plane PM defined by each flat electrode EP; a plurality of first layers CI of an insulating material, each flat electrode EP of the plurality of flat electrodes EP being separated from the preceding and/or following flat electrode EP by a first layer CI of an insulating material of the plurality of first layers CI of an insulating material. The 3D memory also comprises a plurality of third electrodes EF, referred to as floating electrodes, each floating electrode EF being situated between the flat electrode EP with which it is associated and the vertical electrode EV; a plurality of first layers C1 of a first active material separating each flat electrode EP from the floating electrode EF that is associated therewith; a second layer of a second active material separating the vertical electrode EV from each floating electrode EF of the plurality of floating electrodes EF. Moreover, the first active material is capable of forming a selector SE or a memory point PM and the second active material is capable of forming a memory point PM or a selector SE.

Figure 15A:
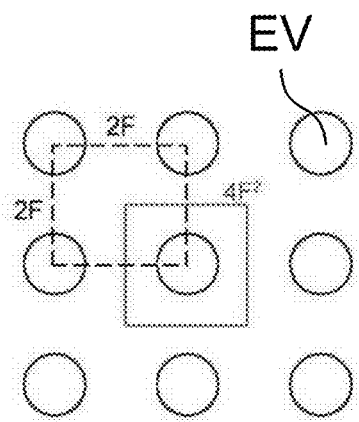
FIG. 15 illustrates two possible configurations of trenches in a method according to a third or a fourth aspect of the invention.
Figure 15B:
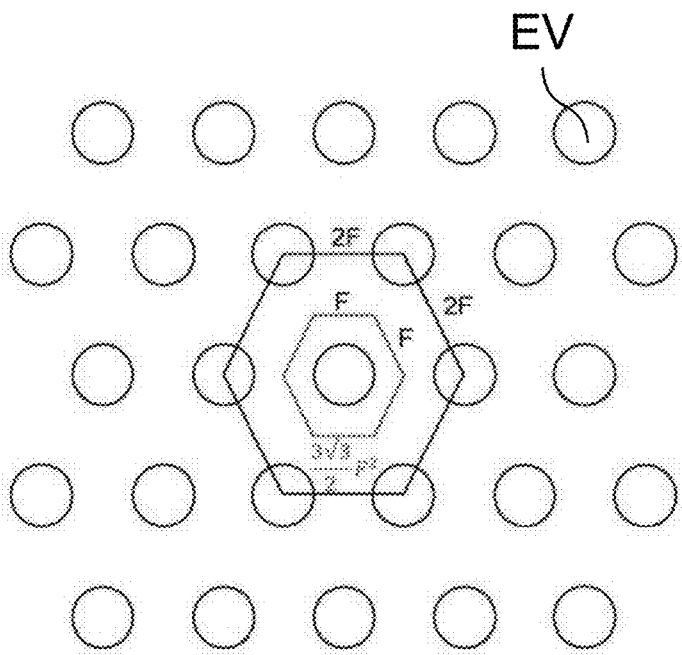

Obviously, in the embodiments described above, a 3D memory CO comprising a single vertical electrode EV has been considered for reasons of clarity. However, the manufacturing method applies in an identical manner for the manufacture of a 3D memory CO comprising a plurality of vertical electrodes EV. The only modification relates to the first step AG1 of anisotropic etching during which not one, but a plurality of openings OUV must be made so as to obtain a plurality of vertical electrodes EV. When a 3D memory CO according to the invention comprises a plurality of vertical electrodes EV, it is possible to vary the arrangement of the vertical electrodes EV with respect to each other. FIG. 15A illustrates a first arrangement in which the projection of the plurality of vertical electrodes EV on a plane parallel to the planes P formed by the flat electrodes EP forms a network of which the elementary mesh is a square mesh. FIG. 15B for its part illustrates a second arrangement in which the projection of the plurality of vertical electrodes EV on a plane parallel to the planes P formed by the flat electrodes EP forms a network of which the elementary mesh is a diamond mesh. The structure of FIG. 15B proposes a density of vertical electrodes EV (and thus of memory points PM) higher than the structure of FIG. 15A. Other elementary meshes may obviously be envisaged.

The invention claimed is:

1. A three dimensional memory comprising:
    a plurality of flat electrodes, each flat electrode of the plurality of flat electrodes defining a plane;
    a vertical electrode, extending essentially along an axis perpendicular to the plane defined by each flat electrode;
    a plurality of floating electrodes, each floating electrode of the plurality of floating electrodes being situated between a flat electrode of the plurality of flat electrodes and the vertical electrode;
    a plurality of first layers of an insulating material, each flat electrode of the plurality of flat electrodes being separated from the preceding and/or following flat electrode by a first layer of an insulating material of the plurality of first layers of an insulating material;
    a plurality of first layers of a first active material, each layer of an active material separating a flat electrode of the plurality of flat electrodes from the floating electrode that is associated therewith;
    a second layer of a second active material separating the vertical electrode from the floating electrodes of the plurality of floating electrodes;
    the first active material being capable of forming a selector or a memory point and the second active material being capable of forming a memory point or a selector, wherein each flat electrode of the plurality of flat electrodes comprises:
        a first sub-layer made of a first conductive material;
        a second sub-layer made of a second conductive material; and
        a third sub-layer made of a third conductive material.

2. The memory according to claim 1, wherein an end of the first sub-layer nearest the vertical electrode and an end of the third sub-layer nearest the vertical electrode are closer to the vertical electrode than an end of the second sub-layer nearest the vertical electrode so as to form an indentation, a part of the floating electrode being inserted into said indentation.

3. The memory according to claim 2, wherein the proximal end of the first sub-layer and the proximal end of the third sub-layer are further away from the vertical electrode than the proximal end of the second sub-layer so as to form a protuberance.

4. The memory according to claim 3, wherein a thickness of the floating electrode associated with the considered flat electrode is greater than a thickness of the second sub-layer of the flat electrode.

5. A method for manufacturing a 3D memory comprising:
    a first step of deposition of a first layer of an insulating material;
    a second step of deposition of a first layer of a conductive material on the first layer of an insulating material;
    the first step of deposition of a first layer of an insulating material and the second step of deposition of a first layer of a conductive material being repeated so as to obtain a plurality of first layers of an insulating material and a plurality of first layers of a conductive material, the method also comprising:
        a first step of anisotropic etching in the plurality of first layers of an insulating material and in the plurality of first layers of a conductive material;
        a first step of selective etching of the plurality of first layers of a conductive material;
        a fourth step of conformal deposition of a first layer of a first active material;
        a fifth step of deposition of a second layer of a conductive material;
        a second step of anisotropic etching of the layer of a conductive material and the layer of a first active material;
        a sixth step of conformal deposition of a second layer of a second active material;
        a seventh step of deposition of a third layer of a conductive material;
    wherein the second step of deposition of a first layer of a conductive material on the first layer of an insulating material comprises:
        a step of deposition of a first sub-layer made of a first conductive material;
        a step of deposition of a second sub-layer made of a second conductive material;
        a step of deposition of a third sub-layer made of a third conductive material;

the material of the first sub-layer and the material of the third sub-layer being etched at a rate different to that at which the material of the second sub-layer is etched during the first step of selective etching of the plurality of first layers of a conductive material.

6. The method according to claim 5, wherein the first material of the first sub-layer and the third material of the third sub-layer are etched at a rate slower than the rate at which the second material of the second sub-layer is etched during the first step of selective etching of the plurality of first layers of a conductive material.

7. The method according to claim 5, wherein the first material of the first sub-layer and the third material of the third sub-layer are etched at a rate faster than the rate at which the second material of the second sub-layer is etched during the first step of selective etching of the plurality of first layers of a conductive material.

8. A method for manufacturing a 3D memory comprising:
  a first step of deposition of a first layer of a first insulating material;
  a second step of deposition of a second layer of a second insulating material on the first layer of a first insulating material;
the first step of deposition of a first layer of a first insulating material and the second step of deposition of a second layer of a second insulating material being repeated so as to obtain a plurality of first layers of a first insulating material and a plurality of second layers of a second insulating material, the method also comprising:
  a first step of anisotropic etching in the plurality of first layers of a first insulating material and in the plurality of second layers of a second insulating material so as to create a first opening;
  a first step of selective etching of the plurality of second layers of a second insulating material;
  a third step of deposition of a first layer of a conductive material;
  a second step of anisotropic etching of the first layer of a conductive material;
  a fourth step of conformal deposition of a second layer of a second active material;
  a fifth step of deposition of a second layer of a conductive material;
  a third step of anisotropic etching in the plurality of first layers of a first insulating material and in the plurality of second layers of a second insulating material, so as to obtain a second opening taking the form of a trench;
  a second step of selective etching of the plurality of second layers of a second insulating material;
  a sixth step of conformal deposition of a first layer of a first active material;
  a seventh step of deposition of a third layer of a conductive material;
  a fourth step of anisotropic etching of the third layer of a conductive material and the first layer of a first active material.

9. A method for manufacturing a 3D memory comprising:
  a first step of deposition of a first layer of a first insulating material;
  a second step of deposition of a second layer of a second insulating material on the first layer of a first insulating material;
the first step of deposition of a first layer of a first insulating material and the second step of deposition of a second layer of a second insulating material being repeated so as to obtain a plurality of first layers of a first insulating material and a plurality of second layers of a second insulating material, the method also comprising:
  a first step of anisotropic etching in the plurality of first layers of a first insulating material and in the plurality of second layers of a second insulating material so as to create a first opening;
  a first step of selective etching of the plurality of second layers of a second insulating material;
  a third step of conformal deposition of a first layer of a first active material;
  a fourth step of deposition of a first layer of a conductive material;
  a second step of anisotropic etching of the first layer of a conductive material and the first layer of a first active material;
  a fifth step of conformal deposition of a second layer of a second active material;
  a sixth step of deposition of a second layer of a conductive material;
  a third step of anisotropic etching in the plurality of first layers of a first insulating material and in the plurality of second layers of a second insulating material, so as to obtain a second opening taking the form of a trench;
  a second step of selective etching of the plurality of second layers of a second insulating material;
  a seventh step of deposition of a third layer of a conductive material;
  a fourth step of anisotropic etching of the third layer of a conductive material.

* * * * *